(12) United States Patent
Argo et al.

(10) Patent No.: US 8,877,541 B2
(45) Date of Patent: Nov. 4, 2014

(54) NANOSTRUCTURE AND PHOTOVOLTAIC CELL IMPLEMENTING SAME

(71) Applicants: Q1 Nanosystems, Inc., Sacramento, CA (US); The Regents of the University of California, Oakland, CA (US)

(72) Inventors: Brian Argo, Hortonville, WI (US); Ruxandra Vidu, Citrus Heights, CA (US); Pieter Stroeve, Davis, CA (US); John Argo, West Sacramento, CA (US); Jie-Ren Ku, Davis, CA (US)

(73) Assignees: Q1 Nanosystems, Inc., Sacramento, CA (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 13/720,168

(22) Filed: Dec. 19, 2012

(65) Prior Publication Data
US 2013/0189810 A1 Jul. 25, 2013

Related U.S. Application Data

(63) Continuation of application No. 11/466,416, filed on Aug. 22, 2006, now Pat. No. 8,344,241.

(60) Provisional application No. 60/710,097, filed on Aug. 22, 2005, provisional application No. 60/710,262, filed on Aug. 22, 2005.

(51) Int. Cl.
| | |
|---|---|
| *H01L 21/00* | (2006.01) |
| *B82Y 30/00* | (2011.01) |
| *H01L 31/0216* | (2014.01) |
| *H01L 31/0352* | (2006.01) |
| *H01L 31/068* | (2012.01) |
| *H01L 31/052* | (2014.01) |
| *B82Y 10/00* | (2011.01) |
| *B82Y 40/00* | (2011.01) |
| *H01L 31/18* | (2006.01) |

(52) U.S. Cl.
CPC ......... *H01L 31/035227* (2013.01); *B82Y 30/00* (2013.01); *H01L 31/02167* (2013.01); *H01L 31/0352* (2013.01); *Y02E 10/547* (2013.01); *H01L 31/068* (2013.01); *Y10S 977/762* (2013.01); *H01L 31/0527* (2013.01); *H01L 31/0522* (2013.01); *Y10S 977/948* (2013.01); *B82Y 10/00* (2013.01); *Y10S 977/891* (2013.01); *B82Y 40/00* (2013.01); *H01L 31/18* (2013.01)

USPC .............. 438/80; 977/762; 977/948; 977/891

(58) Field of Classification Search
USPC .......................................... 257/9, 26; 438/40
See application file for complete search history.

(56) References Cited

U.S. PATENT DOCUMENTS

| | | |
|---|---|---|
| 3,150,999 A | 9/1964 | Rudenberg et al. |
| RE29,833 E | 11/1978 | Mlavsky |

(Continued)

FOREIGN PATENT DOCUMENTS

| | | |
|---|---|---|
| CN | 1855552 A | 11/2006 |
| EP | 1 703 569 A2 | 9/2006 |

(Continued)

OTHER PUBLICATIONS

Office Action issued in Japanese Patent Application No. 2008-540017, mailed on Dec. 4, 2012.

(Continued)

*Primary Examiner* — Matthew Reames
(74) *Attorney, Agent, or Firm* — The Marbury Law Group, PLLC

(57) ABSTRACT

Nanostructures and photovoltaic structures are disclosed. A nanostructure according to one embodiment includes an array of nanocables extending from a substrate, the nanocables in the array being characterized as having a spacing and surface texture defined by inner surfaces of voids of a template; an electrically insulating layer extending along the substrate; and at least one layer overlaying the nanocables. A nanostructure according to another embodiment includes a substrate; a portion of a template extending along the substrate, the template being electrically insulative; an array of nanocables extending from the template, portions of the nanocables protruding from the template being characterized as having a spacing, shape, and surface texture defined by previously-present inner surface of voids of the template; and at least one layer overlaying the nanocables.

7 Claims, 19 Drawing Sheets

(56) References Cited

U.S. PATENT DOCUMENTS

| | | |
|---|---|---|
| 4,234,352 A | 11/1980 | Swanson |
| 4,454,372 A | 6/1984 | Appleby |
| 5,178,685 A | 1/1993 | Borenstein et al. |
| 5,371,470 A | 12/1994 | Jeng |
| 5,411,897 A | 5/1995 | Harvey et al. |
| 5,476,553 A | 12/1995 | Hanoka et al. |
| 5,916,375 A | 6/1999 | Agui et al. |
| 6,337,283 B1 | 1/2002 | Verlinden et al. |
| 6,372,538 B1 | 4/2002 | Wendt et al. |
| 6,372,980 B1 | 4/2002 | Freundlich |
| 6,383,923 B1 | 5/2002 | Brown et al. |
| 6,423,568 B1 | 7/2002 | Verlinden et al. |
| 6,448,105 B1 | 9/2002 | Sterk |
| 6,548,751 B2 | 4/2003 | Sverdrup, Jr. et al. |
| 6,559,479 B1 | 5/2003 | Ludemann |
| 6,583,349 B2 | 6/2003 | Tanaka |
| 6,660,930 B1 | 12/2003 | Gonsiorawski |
| 6,852,920 B2 | 2/2005 | Sager et al. |
| 6,872,450 B2 | 3/2005 | Liu et al. |
| 6,878,871 B2 | 4/2005 | Scher et al. |
| 6,882,051 B2 | 4/2005 | Majumdar et al. |
| 6,946,597 B2 | 9/2005 | Sager et al. |
| 7,051,945 B2 | 5/2006 | Empedocles et al. |
| 7,083,104 B1 | 8/2006 | Empedocles et al. |
| 7,135,350 B1 | 11/2006 | Smith et al. |
| 7,253,017 B1 | 8/2007 | Roscheisen et al. |
| 7,589,880 B2 | 9/2009 | Kempa et al. |
| 7,649,665 B2 | 1/2010 | Kempa et al. |
| 7,754,964 B2 | 7/2010 | Kempa et al. |
| 7,847,180 B2 | 12/2010 | Argo et al. |
| 7,943,847 B2 | 5/2011 | Kempa et al. |
| 2002/0011641 A1 | 1/2002 | Oswald et al. |
| 2002/0130311 A1 | 9/2002 | Lieber et al. |
| 2002/0175408 A1 | 11/2002 | Majumdar et al. |
| 2003/0010971 A1* | 1/2003 | Zhang et al. ............... 257/15 |
| 2003/0041894 A1 | 3/2003 | Sverdrup, Jr. et al. |
| 2003/0089392 A1* | 5/2003 | Rohr et al. ............... 136/255 |
| 2004/0060591 A1 | 4/2004 | Den |
| 2004/0063320 A1 | 4/2004 | Hollars |
| 2004/0075464 A1* | 4/2004 | Samuelson et al. ......... 326/37 |
| 2004/0123896 A1 | 7/2004 | Lemmon et al. |
| 2004/0144420 A1 | 7/2004 | Takeyama et al. |
| 2004/0144985 A1 | 7/2004 | Zhang et al. |
| 2004/0146560 A1 | 7/2004 | Whiteford et al. |
| 2004/0250848 A1 | 12/2004 | Sager et al. |
| 2005/0040374 A1 | 2/2005 | Chittibabu et al. |
| 2005/0079659 A1 | 4/2005 | Duan et al. |
| 2005/0098204 A1 | 5/2005 | Roscheisen et al. |
| 2005/0121068 A1 | 6/2005 | Sager et al. |
| 2005/0126628 A1 | 6/2005 | Scher et al. |
| 2005/0189015 A1 | 9/2005 | Rohatgi et al. |
| 2005/0217717 A1 | 10/2005 | Faris |
| 2006/0024438 A1 | 2/2006 | Ku et al. |
| 2006/0038182 A1 | 2/2006 | Rogers et al. |
| 2006/0131679 A1* | 6/2006 | Hantschel et al. ......... 257/415 |
| 2006/0207647 A1 | 9/2006 | Tsakalakos et al. |
| 2007/0029561 A1 | 2/2007 | Cho et al. |
| 2007/0137697 A1 | 6/2007 | Kempa et al. |
| 2007/0240757 A1 | 10/2007 | Ren et al. |
| 2008/0251122 A1 | 10/2008 | Ready |
| 2009/0250105 A1 | 10/2009 | Lee |
| 2011/0308564 A1 | 12/2011 | Kempa et al. |

FOREIGN PATENT DOCUMENTS

| | | |
|---|---|---|
| JP | 6-104463 A | 4/1994 |
| JP | 11-246300 A | 9/1999 |
| JP | 3151672 B2 | 4/2001 |
| JP | 2005-059125 A | 3/2005 |
| JP | 2005-076039 A | 3/2005 |
| JP | 2005059125 A | 3/2005 |
| JP | 20050076039 A | 3/2005 |
| JP | 2006261666 A2 | 9/2006 |
| WO | 2004/044948 A2 | 5/2004 |
| WO | 2007/040594 A2 | 4/2007 |

OTHER PUBLICATIONS

Kuiqing Ping et al., Aligned Single-Crystalline Si Nanowire Arrays for Photovoltaic Applications [onine], Small, 2005, vol. 1, Issue 11, pp. 1062-1067.

Darius Snieckus; "A different dimension"; US Solar, Innovation; www.rechargenews.com; Feb. 4, 2011.

Kayes et al., "Comparison of the device physics principles of planar and radial p-n junction nanorod solar cells" Journal of Applied Physics 97, American Institute of Physics 2005.

Kayes, Brendan "Radial P-N Junction Nanorod Solar Cells" Applied Physics Candidacy Presentation Sep. 7, 2004.

Final Office Action Summary from U.S. Appl. No. 12/508,815 dated May 30, 2012.

Non-Final Office Action Summary from U.S. Appl. No. 12/911,657 dated Feb. 6, 2012.

Restriction/Election Requirement from U.S. Appl. No. 12/508,815 dated Aug. 2, 2011.

PCT International Preliminary Report on Patentability from application No. PCTIUS2010/039552 dated Jan. 12, 2012.

"Konarka: Vision and Mission" 2011 Konarka Technologies, Inc., www.konarkatech.com/aboutl, 2 pages.

Glaeser, Andreas M., "Model studies of Rayleigh instabilities via microdesigned interfaces," Lawrence Berkeley National Laboratory, Oct. 17, 2000, 39 pages.

Non-Final Office Action Summary from U.S. Appl. No. 12/508,815 dated Nov. 10, 2011.

U.S. Appl. No. 13/289,979, filed Nov. 4, 2011.

U.S. Appl. No. 13/289,968, filed Nov. 4, 2011.

Restriction Requirement from U.S. Appl. No. 12/911,657 dated Sep. 1, 2011.

Office Action Summary from Japanese Application No. 2008-540018 dated Oct. 4, 2011 (no translation).

Office Action Summary from Japanese Application No. 2008-540017 dated Sep. 27, 2011 (no translation).

Non Final Office Action Summary from U.S. Appl. No. 12/508,815 dated Nov. 10, 2011.

International Preliminary Report of Patentability from PCT Application No. PCT/US06/32987 mailed Jul. 22, 2009.

International Search Report and Written Opinion from PCT Application No. PCT/US06/32986 mailed on Sep. 10, 2008.

Peng et al., "Aligned Singel-Crystalline Si Nanowire Arrays for Photovoltaic Applications" www3.interscience.wiley.com/journa1/111081086/abstract?CRETRY=1&SRETRY=>.

Gaire et al., "Mechanical Testing of Isolated Amorphous Silicon Slanted Nanorods" Journal of Nanoscience and Nanotechnology, vol. 5,1893-1897, 2005.

Kayes et al., "Synthesis and Characterization of Silicon Nanorod Arrays for Solar Cell Applications", Cal Tech Disclosure; May 19, 2006.

Y. Zhang et al., "Coaxial Nanocable: Silicon Carbide and Silicon Oxide Sheathed with Boron Nitride and Carbon", www.sciencemag.org, Science vol. 281, Aug. 14, 1998.

PeriodicTable.com, Technical Data for Gold, available at http://www.peridioctable.com/Elements/079/data.html (last visited Nov. 18, 2009).

PeriodicTable.com, Technical Data for Tellurium, available at http://www.periodictable.com/Elements/052/data.html (last visited Nov. 18, 2009).

Encyclopedia Britannica, Shear Modulus, available at http://www.britannica.com/EBchecked/topic/539275/shear-modulus (last visited Nov. 18, 2009).

Stroeve et al. 2004, Fabrication of Nanocables by Electrochemical Depostiion Inside Metal Nanotubes, J. Am. Chem. Soc., 2004, 126: 15022-15023.

Stroeve et al. 2005, Modeling Electrochemcial Deposition inside Nanotubes to Obtain Metal-Semiconductor Multiscale Nanocables or Concial Nanopores, J. Phys. Chem. B, 2005, 109: 14523-14528.

(56) References Cited

OTHER PUBLICATIONS

Xia et al., Ag Nanowires Coated with Ag/Pd Alloy Sheaths and Their Use as Substrates for Reversible Absorption and Desportion of Hydrogen, J. Am. Chem. Soc. 2004, 126: 5940-5941.
PeriodicTable.com, Technical Data for Silver, available at http://www.peridioctable.com/Elements/047/data.html (last visited Nov. 18, 2009).
PeriodicTable.com, Technical Data for Palladium, available at http://www.periodictable.com/Elements/046/data.html (last visited Nov. 18, 2009).
Indium Tin Oxide; Material Property Database; http://www.mit.edu/~6.777/matprops/ito.htm; accessed May 14, 2014.
John David Jackson; Professor of Physics, University of Illinois; Classical Electrodynamics; John Wiley & Sons, Inc.1998.
Optical Constants of IN O-SnO (ITO, Indium Tin Oxide); Refractive index of In2O3-SnO2 (ITO, Indium tin oxide) [Crystals etc.]—Refractive Index Info; http://refractiveindex.info/legacy/?group=CRYSTALS&material=ITO; accessed on May 14, 2014.
Optical Constants of ZnO (Zinc Oxide); Refractive index of IZnO (Zinc Oxide) [Crystals etc.]—Refractive Index Info; http://refractiveindex.info/legacy/?group=CRYSTALS&material=ZnO; accessed on May 14, 2014.
Jeong-Eun Kim et al.; Electrical and Optical Properties of Zinc Oxide Thin Films Deposited Using Atomic Layers Deposition; Journal of the Korean Ceramic Society; vol. 47, No. 4, pp. 353-356; 2010.
Japanese Office Action issued in JP Application No. 2008-540017, mailed Sep. 9, 2014.

\* cited by examiner

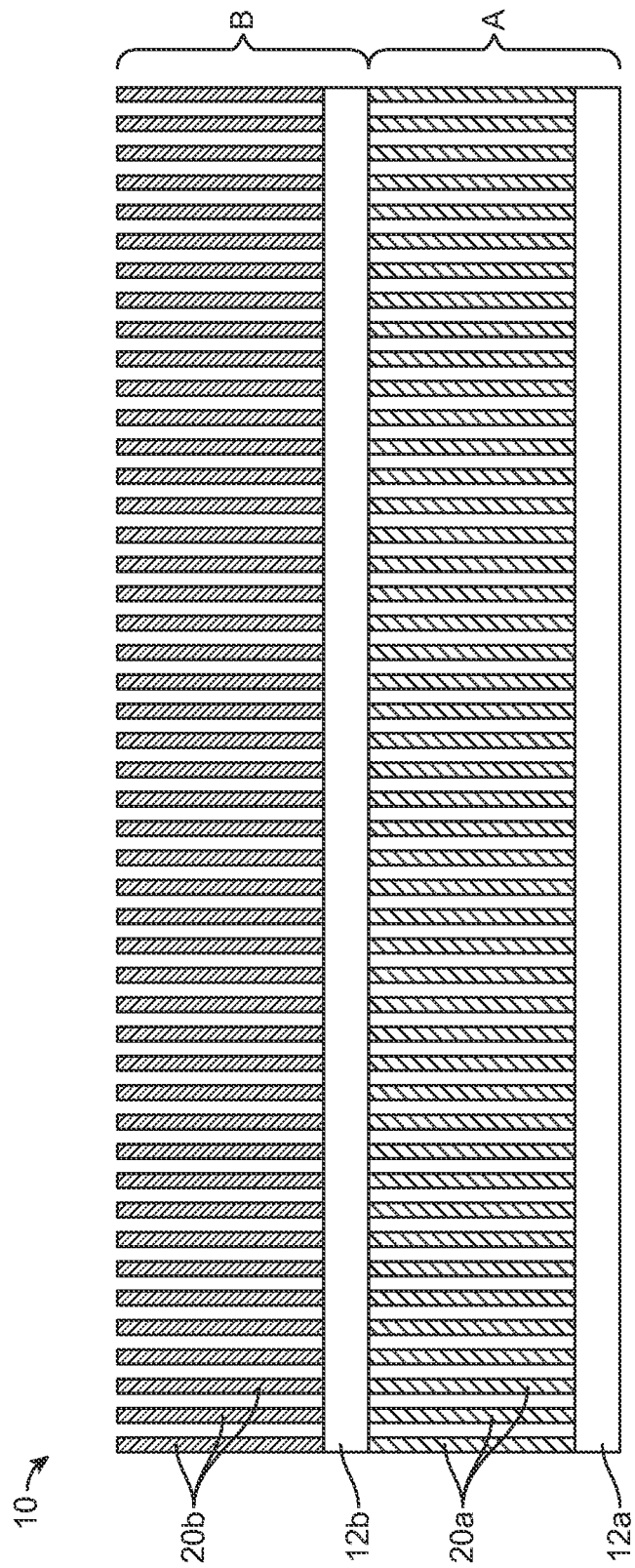

NANOSTRUCTURE AND PHOTOVOLTAIC CELL IMPLEMENTING SAME

RELATED APPLICATIONS

This application is a Divisional Application of U.S. patent application Ser. No. 11/466,416, filed Aug. 22, 2006, which claims the benefit of priority to U.S. Provisional Patent Application No. 60/710,097, filed Aug. 22, 2005 and U.S. Provisional Patent Application Ser. No. 60/710,262 filed Aug. 22, 2005. The entire contents of all three applications are hereby incorporated by reference.

FIELD OF INVENTION

This invention pertains generally to nanotechnology and particularly to nano-scale structures and processes for making these structures.

BACKGROUND

Solar panels that harness solar energy and convert it to electrical energy are well known. A typical solar electricity system includes the following components: solar panels, charge controller, inverter, and often batteries. A typical solar panel, often referred to as a photovoltaic (PV) module, consists of a one or more interconnected PV cells environmentally sealed in protective packaging consisting of a glass cover and extruded aluminum casing.

The PV cell may be a p-n junction diode capable of generating electricity in the presence of sunlight. It is often made of crystalline silicon (e.g., polycrystalline silicon) doped with elements from either group 13 (group III) or group 15 (group V) on the periodic table. When these dopant atoms are added to the silicon, they take the place of silicon atoms in the crystalline lattice and bond with the neighboring silicon atoms in almost the same way as the silicon atom that was originally there. However, because these dopants do not have the same number of valence electrons as silicon atoms, extra electrons or "holes" become present in the crystal lattice. Upon absorbing a photon that carries an energy that is at least the same as the band gap energy of the silicon, the electrons become free. The electrons and holes freely move around within the solid silicon material, making silicon conductive. The closer the absorption event is to the p-n junction, the greater the mobility of the electron-hole pair.

When a photon that has less energy than silicon's band gap energy strikes the crystalline structure, the electrons and holes are not mobilized. Instead of the photon's energy becoming absorbed by the electrons and holes, the difference between the amount of energy carried by the photon and the band gap energy is converted to heat.

While the idea of converting solar energy to electrical power has much appeal, conventional solar panels have limited usage because their efficiencies are generally only in the range of 15% and are manufactured using costly silicon wafer manufacturing processes and materials. This low efficiency is due in part to the planar configuration of current PV cells, as well as the relatively large distances between the electrodes and the P—N junction. Low efficiency means that larger and heavier arrays are needed to obtain a certain amount of electricity, raising the cost of a solar panel and limiting its use to large-scale structures.

The most common material for solar cells is silicon. Crystalline silicon comes in three categories: single-crystal silicon, polycrystalline silicon, and ribbon silicon. Solar cells made with single or monocrystalline wafers have the highest efficiency of the three, at about 20%. Unfortunately, single crystal cells are expensive and round so they do not completely tile a module. Polycrystalline silicon is made from cast ingots. They are made by filling a large crucible with molten silicon and carefully cooling and solidifying them. The polycrystalline silicon is less expensive than single crystal, but is only about 10-14% efficient depending on the process conditions and resulting imperfections in the material. Ribbon silicon is the last major category of PV grade silicon. It is formed by drawing flat, thin films from molten silicon, and has a polycrystalline structure. Silicon ribbon's efficiency range of 11-13% is also lower than monocrystalline silicon due to more imperfections. Most of these technologies are based on wafers about 300 µm thick. The PV cells are fabricated then soldered together to form a module.

Another technology under development is multijunction solar cells, which is expected to deliver less than 18.5% efficiency in actual use. The process and materials to produce multijunction cells are enormously expensive. Those cells require multiple gallium/indium/arsenide layers. The best is believed to be a sextuple junction cell. Current multijunction cells cannot be made economical for large-scale applications A promising enabler of PV cells and other technology is nanotechnology. However, one problem with implementing nanotechnology is that the minute conductors may not be able to withstand their own formation, much less subsequent processing conditions or conditions of use in the end product. For example, the metal forming the nanoconductors may be soft, making it prone to bending or breaking during application of additional layers.

Further, it has heretofore proven difficult and even impossible to create nanoarrays having structures of uniform size and/or spacing.

Thus, as alluded to, the technology available to create PV cells and other electronic structures is limited to some extent by processing limitations as well as the sheer fragileness of the structures themselves.

Therefore, it would be desirable to enable creation of nanostructures having high aspect ratios and yet are durable enough for practical use in industry.

It would also be desirable to enable fabrication of a solar cell that has a higher than average efficiency, and in some embodiments, higher than about 20%.

SUMMARY

A photovoltaic structure according to one embodiment of the present invention includes an array of photovoltaic nanostructures, and a photovoltaic device, the photovoltaic device being at least semi-transparent. The array is positioned relative to the photovoltaic device such that light passing through the photovoltaic device strikes the array.

Various configurations are contemplated. In one aspect, the array of photovoltaic nanostructures is arranged in a brush configuration. Axes of the photovoltaic nanostructures may be tilted from a direction normal to the array. In another aspect, the photovoltaic device is a planar photovoltaic structure.

In a further aspect, the photovoltaic device is a second array of photovoltaic nanostructures. The first and second arrays of photovoltaic nanostructures may be arranged in a brush configuration, wherein a height of the photovoltaic nanostructures in the first array is different than an average height of the photovoltaic nanostructures in the second array. In one embodiment, the photovoltaic nanostructures of the first array have the same composition as the photovoltaic nanostructures of the second array. In another embodiment, the photovoltaic nanostructures of the first array have a different composition than the photovoltaic nanostructures of the second array. For example, the photovoltaic nanostructures of the first array may comprise an organic material, wherein the photovoltaic nanostructures of the second array comprise inorganic materials. In another example, the photovoltaic nanostructures of the first array comprise inorganic materials, wherein the photovoltaic nanostructures of the second array comprise inorganic materials.

The nanostructures of the second array may be coated with at least one high bandgap material, and the nanostructures of the first array are coated with at least one low bandgap material.

A nanostructure according to one embodiment of the present invention includes an array of nanocables extending from a substrate, the array of nanocables being formed using a template, an insulating layer extending along the substrate, and at least one layer overlaying the nanocables.

The nanocables may be elongated.

The template may be partially removed. At least a portion of the template may form the insulating layer.

The nanocables may have substantially uniform peripheries.

The template may be a membrane.

The at least one layer may be electroplated, may be formed by chemical vapor deposition and etching, etc.

A nanostructure according to yet another embodiment of the present invention includes a nanocable having a rough outer surface and a solid core.

A method for creating a nanostructure according to yet another embodiment of the present invention includes depositing material in a template for forming an array of nanocables, removing the template, forming an insulating layer between the nanocables, and forming at least one layer over the nanocables. The at least one layer may be formed by electroplating. The at least one layer may be formed by chemical vapor deposition, while etching may be used to expose the insulating layer. The at least one layer may create a photovoltaically active p-n junction.

A method for creating a nanostructure according to yet another embodiment of the present invention includes depositing material in a template for forming an array of nanocables, removing only a portion of the template such that the template forms an insulating layer between the nanocables, and forming at least one layer over the nanocables. The at least one layer is formed by electroplating, chemical vapor deposition, etc. The at least one layer may create a photovoltaically active p-n junction.

A method for creating a nanostructure according to yet another embodiment of the present invention includes depositing material in a template for forming an array of pillars, removing the template, forming at least one layer over the pillars such that the pillars are covered by the at least one layer, and depositing a metal contact over the at least one layer such that the at least one layer is covered by the metal contact.

A method for creating a reinforced nanostructure according to yet another embodiment of the present invention includes forming a nanotube of a first material in a template, forming a nanocable of a second material in the nanotube, and at least partially removing the template. Preferably, the first material is more rigid than the second material. Also preferably, the first material has a higher heat resistance than the second material.

A method for creating a reinforced nanostructure according to yet another embodiment of the present invention includes forming a nanotube of a first material in a template, forming a nanocable of a second material in the nanotube, removing the nanotube from between the template and the nanocable, depositing a reinforcing layer between the template and the nanocable, and at least partially removing the template.

A method for creating an array of nanotubes having a defined width perpendicular to an axis thereof according to yet another embodiment of the present invention includes forming a nanotube of a polymeric material in a template, forming a nanocable of a second material in the nanotube, at least partially removing the template, and at least partially removing the polymeric material.

A method for creating a nanocable with a rough outer surface according to yet another embodiment of the present invention includes plating a thin film of metal over the surface of a metallic nanocable such that the metal forms alloys with the nanocable at the surface of the nanocable, and removing the metal from the surface of the nanocable, wherein the outer surface of the nanocable is rough upon removal of the metal.

A method for creating a nanocable through etching a membrane on a conductor according to yet another embodiment of the present invention includes depositing material in a template for forming an array of nanocables, removing the template, forming an insulating layer between the nanocables, and forming at least one layer over the nanocables.

Thus, one embodiment of the invention includes a method of forming conductive nanostructures. The method allows a precise control of radial and vertical dimensions of the conductive core and semiconductor coating(s). The resulting nanostructure is known as a nanocable. With the method, nanocable arrays can be molded into any number of geometries, and then made rigid. Nanocable arrays may be made flexible, if desired. Nanocable arrays made according to the invention have improved electrical junctions, improved reliability, and improved performance.

In another aspect, the invention is a PV structure that overcomes many limitations of current PV cell designs. With the PV cell disclosed herein, all photon absorption events occur near the p-n junction for maximum efficiency. Light is diluted up to several orders of magnitude to reduce hot spots throughout the cell. The design can reduce back reflection of photovoltaic cells to less than 1%, and reduces the quantities of scarce materials needed to produce a photovoltaic cell. Nanocable semiconductor layers may be tuned to be spectrally selective of different light wavelengths to further increase performance. Thus, the PV cell overall reduces the cost unit area for most photovoltaic materials and increases high output industrial power.

In yet another aspect, the invention is a method of enhancing the structural soundness of a nanocable structure having a metal nanocable. Where the nanocable is made of a "soft" metal such as gold or copper, the nanocable may be coated with a harder metal or compound for structural reinforcement. Metals can also be deposited as alloys to increase the hardness of the nanocable.

The invention according to another embodiment includes a method of using organic polymer thin films to precisely control the dimensions of a nanocable. One or more organic polymer thin films may be deposited on the inner wall of a pore in a membrane that is used to produce the nanocable, so that when the nanocable material fills the remaining space in the pore, its dimensions will be precisely controlled by the thickness of the polymer layers.

The invention according to another embodiment includes a method of forming nanoporous nanostructures. Using surface alloying, nanostructure surface may be changed from smooth to rough. Nanoporous or nano-rough nanostructure obtained by this method is more robust because the nanoporous layer is confined to a few monolayers in the surface (not the entire bristle volume) and still maintains a plain metallic core.

In another aspect, the invention is a method for creating an integrated nanostructured device—the nanocable array—where the individual elements—the nanocables—are insulated from one another. Each individual structure is a singular device.

BRIEF DESCRIPTION OF THE DRAWINGS

FIGS. 3A and 3B are cross-sectional views of embodiments of the solar brush having a layered structure.

DETAILED DESCRIPTION OF THE EMBODIMENT(S)

The following description is the best mode presently contemplated for carrying out the present invention. This description is made for the purpose of illustrating the general principles of the present invention and is not meant to limit the inventive concepts claimed herein. Further, particular features described herein can be used in combination with other described features in each and any of the various possible combinations and permutations.

Embodiments of the invention are described herein in the context of solar cells. However, it is to be understood that the particular application provided herein is just an exemplary application, and the nanocable arrangement of the invention is not limited to the application or the embodiments disclosed herein.

This disclosure also relates to nano arrays of thin film solar cells. Solar modules constructed using thin film systems tend to use a single larger single plane thin films solar cell, rather than an array of smaller interconnected nano-scale solar cells. The entire module can use a laser scribe to mark individual cells. It is important to note nano systems will be processed differently than current technology thin films. Four main thin film material system types are amorphous silicon (A-Si), copper indium selenide ($CuInSe_2$ commonly referred to as CIS), copper indium gallium selenide ($CuIn_xGa_{1-x}Se_x$) commonly referred to as CIGS), and CdTe/CdS. A-Si films are typically fabricated using plasma enhanced chemical vapor deposition (PE-CVD).

The term "nanocable" denotes any elongated body whose one dimension (e.g. diameter or width) is of nanoscale size and the other dimension is larger, potentially much larger. A nanocable may be fabricated with dissimilar materials, either as a core rod or wire that is laterally enveloped by one or more layers of material(s), as a nanotube that is filled with one or more layers of material(s), or as a single structure of one material. Nanocables are also referred as nanorods or nanowires or filled nanotubes. The functional element of the nanocable in each case is the interface(s) between the two (or more) materials. In various alternative configurations and modes of growth, a succession of layers of different materials, alternating materials or different thicknesses of materials can be deposited to form nested cylinder nanocables.

The term "photovoltaically active p-n junction" denotes any p-n junction with an adequate p-layer and n-layer thickness to generate electricity.

Figure 1:
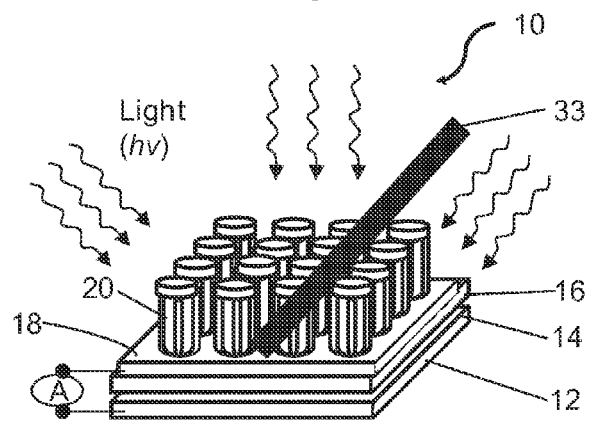
FIG. 1 is a perspective view of an exemplary solar brush that may be used to implement solar panels with improved efficiency.

FIG. 1 is a perspective view of an exemplary solar brush 10 that may be used to implement solar cells with improved efficiency. As shown, the solar brush 10 has a substrate 12, a first conductive layer 14, an insulator layer 16, a second conductive layer 18, and a plurality of bristles 20. Although the bristles 20 are shown to be cylindrically-shaped in the particular embodiment, they may be of any other shape including but not limited to cones, rectangular, domes, or more complex geometries such as branched bristles etc. Each of the bristles 20 has a nanocable extending through its center, and layers of semiconductor around the nanocable. Bristles may protrude vertically from the substrate or may protrude at angles. Bristles protruding at angles may increase the amount of semiconductor materials exposed to the sun when the sun is directly overhead and may improve internal reflections. Bristles can be modified to be smooth or hairy. Hair bristles may improve light absorption efficiency by further increasing the surface area or improving internal reflections. Various shapes can be obtained using asymmetric pore membranes. One or more electrically conductive strips 33 may extend across the array or portion thereof to assist in carrying electricity away from the array, thereby improving the overall efficiency of the brush. The efficiency gains are more pronounced in larger arrays. Such strips 32 are preferably very thin to block minimal light.

Figure 2:
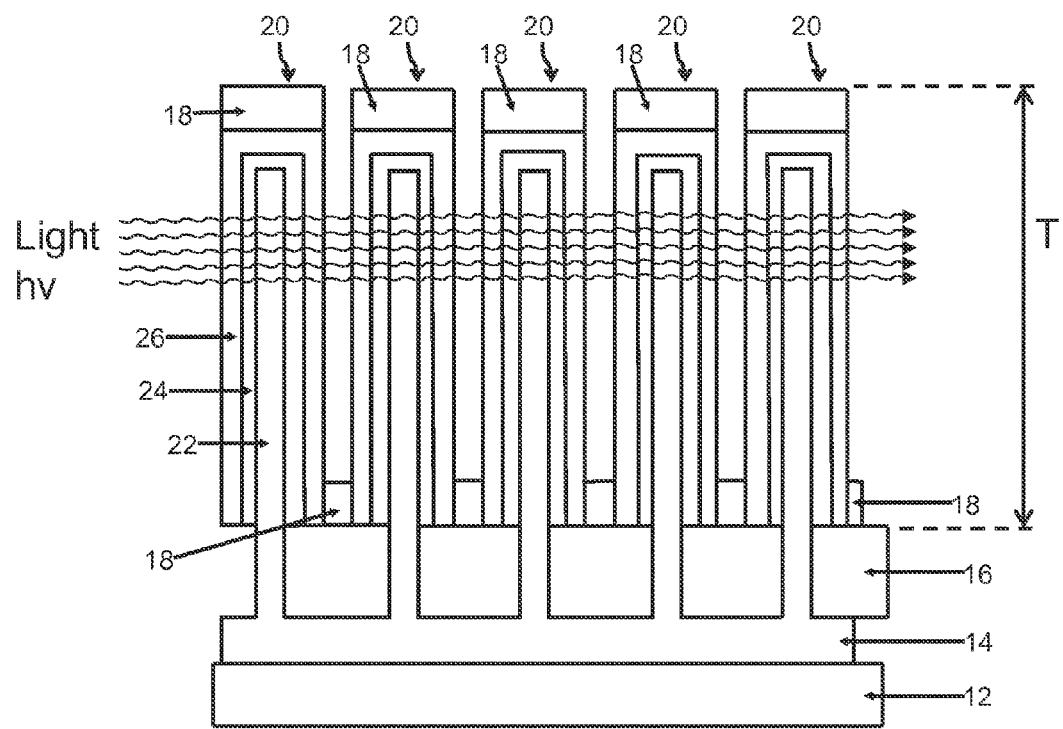
FIG. 2 is a side cross-section of the solar brush.

FIG. 2 is a side cross-section of the solar brush 10 with a metal nanocable. As shown, each of the bristles 20 has a nanocable 22 extending through its core. The nanocable 22 is typically a p-layer conductor, and extends through the insulating layer 16 to electrically connect with the first conductive layer 14. A p-type semiconductive layer 24 of a sufficient thickness surrounds the nanocable 22, and an n-type semiconductive layer 26 of sufficient thickness is coated on the p-type semiconductive layer 24 to create a photovoltaically active p-n junction in each of the bristles 20. An n-layer conductor is deposited on the tops of the bristles 20 and the insulating layer 16 to form the second conductive layer 18.

The closer the photon absorption event is to the p-n junction, the more likely the event will result in usable electricity. In the case of a nanobrush, a reflective back contacting layer is not required because the photon can continue along the linear path so that it can contact the material on the opposite side of the cell thereby achieving a double pass in each nanobristle. In FIG. 2, five cylindrical shell solar brush PV cells are shown. Thus, if the photon passes slightly off-center of the shell it has the potential to come into contact with as many as the equivalent of 10 p-type layers (the layer where the solar event takes place) in this brush design. If the p-layer conductor is sufficiently small most of the photons will pass through five thicker layers. In the actual case, the solar brush, with millions of bristles per cm², would effectively approach the efficiency of 100% of all usable photon energy.

The substrate 12 may be a conductive material or a non-conductive material (coated with a conductive material), rigid or flexible. For example, the substrate 12 could be glass, doped silicon, diamond, metal, polymer, ceramics, or a variety of composite materials. Thin metal foil or certain polymers can be used where flexibility is desired. Structural integrity of the nanocable will vary with material choices. In the case of brittle or easily deformable bristles, a flexible substrate material could be used if attached to a rigid or semi-rigid surface. The molded surface/flexible membrane may be of particular help when PV cells are desired for an aerodynamic surface such as an airplane part, the roof of a car, the surface of other vessels or portable devices.

Each of the bristles 20 is a discrete nanoscale PV cell. Compared to conventional flat PV cells design where only a single "xy" planar surface is exposed to light, the solar brush 10 has an "xyz" or a three-dimensional surface. Thus, for a given volume, the solar brush 10 has a useful surface area that can be several times to thousands of times greater than the "xy" surface area of conventional PV cells. The area between solar bristles 20 could be sufficiently wide as to make the brush absorptive to the majority of photons. Additionally, the bristles may be thin enough to be partially transparent. This effective transparency and bristle spacing would increase effective energy generation to happen from sunrise to sunset while flat PV cells work optimally when the sun is straight above the PV surface. Because the effective energy generation from the solar brush is expected to be many times higher than conventional PV cell technology, the weight per kilowatt generated would be many times lower. This would allow use in small applications such as charging electronic devices (cell phone, computer, PDA, etc.), use in medium scale applications such as light weight roof-top energy for industrial and agricultural power generation, and use in large applications such as a light weight energy source for transportation (automobile, aircraft, barges). The efficiency of the cell would also enable improved power generation in low light conditions. The wide range of spectrum adsorption may also generate power from infra-red light at night time.

Another advantage of using nanocable structures is that the p-n junction associated with each nanocable has a smooth interface that results in a sharper junction. The smoothness is improved at nanoscale as the roughness (measured as rms-root mean square for instance) increases as the scale increases.

It should also be noted that though the axes of the bristles 20 are oriented normal (perpendicular) to the plane of the array in the drawings, the axes of the bristles may be tilted slightly (a few degrees from normal) or pronouncedly (e.g., 40-89 degrees). One reason why a tilted configuration may be desirable is to reduce unimpeded penetration of light into the array when the light is traveling in a direction normal to the array.

FIG. 3A is a perspective view of the solar brush 10 having a layered structure. The structure in FIG. 3A has a layer A and a layer B, with each layer having a substrate 12a, 12b, the first conductive layer (not shown), the insulator layer (not shown), the second conductive layer (not shown), and bristles 20a, 20b. In the layered structure, the substrates 12a, 12b, the first conductive layers, the insulator layers, and the second conductive layers of one or both layers may be at least semi-transparent so that light can travel between the layers A and/or B. When the solar brush 10 is layered, the bristles 20 do not have to be as densely arranged as in the single-layer structure to achieve the same efficiency. The layered structure can be made using cruder, and therefore less expensive, equipment than the single-layered structure with densely arranged bristles 20. Although the embodiment shown in FIG. 3A has two layers of approximately the same bristle height, this is not a limitation of a layered brush structure. Photovoltaic cells with layered brush structures can contain as many layers as desired to generate the desired efficiency and power.

The layered brush structure can also be used to increase photovoltaic cell efficiency by using a high- and low-band gap material and semiconductor thicknesses tuned for spectral selection. A high band gap material can be used to coat the upper photovoltaic brush, and the low band gap material can be used to coat the lower photovoltaic brush. The upper material would convert higher-energy light to electricity and dissipate much heat. The lower material could convert lower-energy light. This would increase both the efficiency and the life span of the lower brush A.

The layered structure does not need to be made of the same material or by the same process. For example, the upper brush could be produced using a conductive/transparent core of silicone and a silicone substrate made from photolithography and chemical vapor deposition and the lower brush made with organic dye technology. This way, the low-band-gap light can easily pass through the upper layer and reach an organic nanocable base. The base may be made from an anodized aluminum template, carbon nanojacket, and wet polymer process. The layers may or may not have the same dimensions and/or composition. The design need not be limited to two types of photovoltaic cells. A multitude of cells can be included with a multitude of photovoltaic materials so long as each cell has adequate transparency for light to reach the cell below.

Figure 3B:
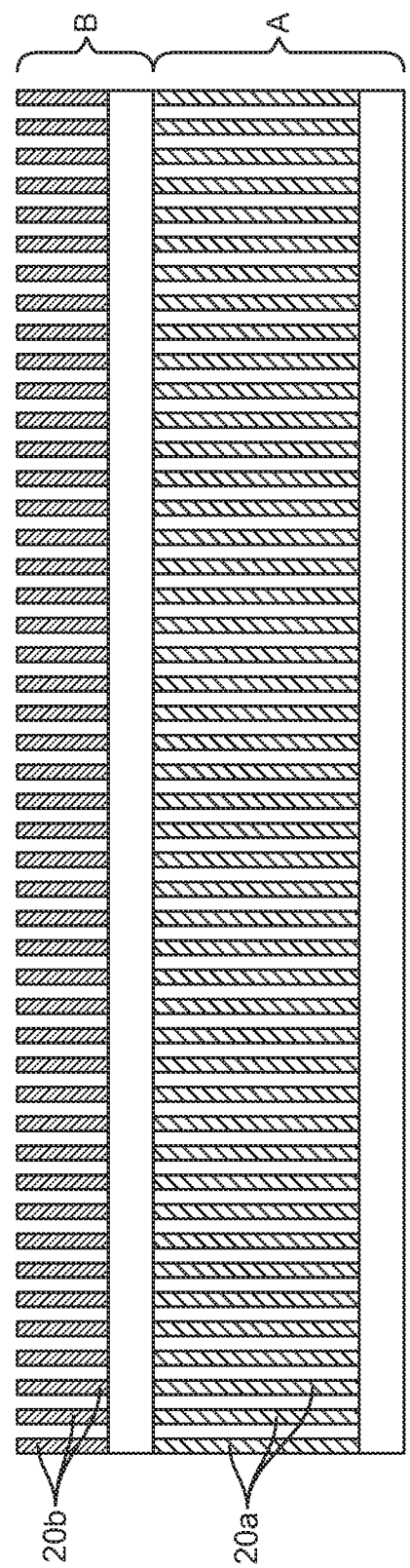

FIG. 3B is a side view of another layered structure wherein the average brush heights are different in the two layers. The embodiment of FIG. 3B illustrates that there can be structural differences between the two layers.

Figure 3C:
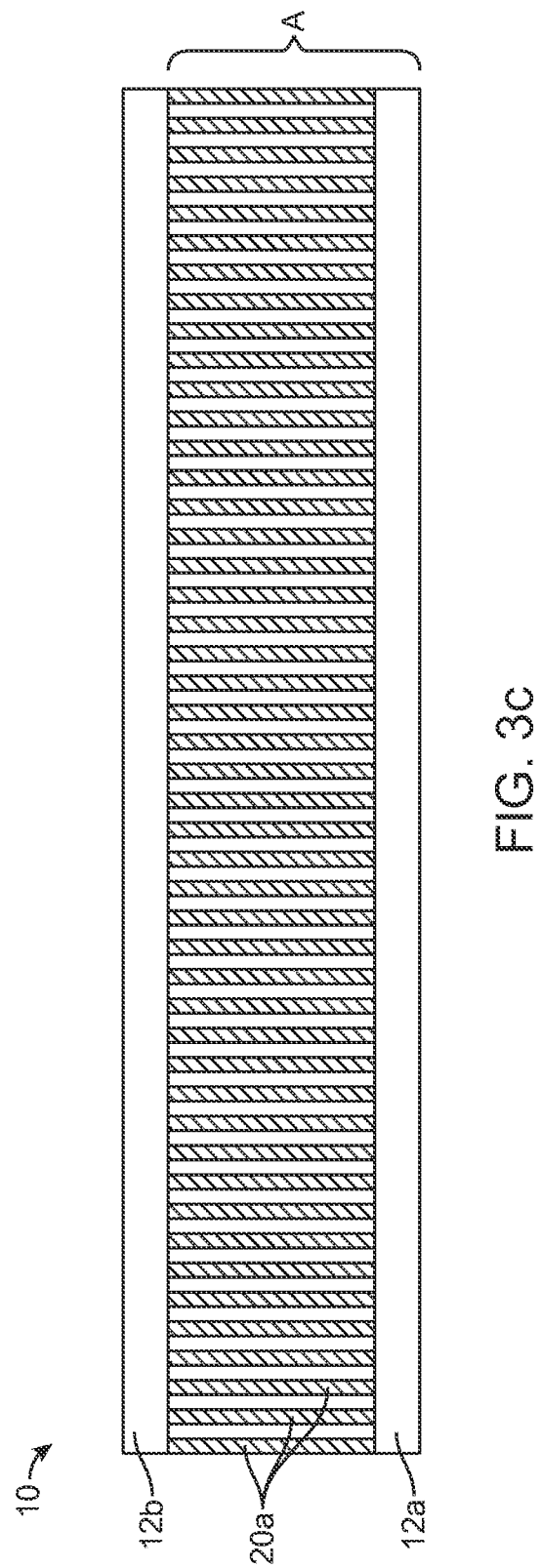
FIG. 3C is a cross-sectional view of a solar brush embodiment employing a thin film planar device as a filter.

FIG. 3C illustrates that a transparent thin film planar device can also be employed as a filter over a brush layer if desired.

Thin, minimal reflectance metals such as gold may be layered along with the n- and p-layers to conduct the current so further gains in efficiency might be achieved.

One benefit over current technology is, as previously mentioned, that the maximum efficiency for a given material can be achieved. Another potential benefit may be achieved by layering material with different band gaps (energies required to excite electrons). The idea is to have a high band gap material such as GaAs (max efficiency ~20%, band gap ~1.4 eV) or CdTe (max efficiency ~30%; band gap ~1.6 eV) at the tip of the bristle and a reduced band gap material further down the bristle such as CIS or CIGS type PV material further down (max efficiency of ~24%; band gap ~0.8 eV). Photons with low energy will not react with high band gap material but will be available to react with low band gap material further down the bristle at further penetration depths. This could be achieved by CVD of CIS material on a nanocable, followed by etching to the top metal core of the nanocable, followed by catalytic growth on top of the nanocable, and the cable would be finished up by electroplating of CdTe/CdS. The solar brush PV cell design could also be a multijunction cell and is a superior architecture for such.

A flexible nanopore substrate can be used as the substrate 12 for deposition of metal. The substrate 12 could be a membrane applied to or constructed on a thin conductive sheet, and may be made into any desired shape. After metal deposition in the membrane pores occurs, the bristles 20 are formed. While other PV tapes and films have XY flexibility and strength, they are limited and no other technology allows for XYZ design of a rigid or flexible long lasting solar cell. The varied geometry of the solar brush allows the PV cells to be optimized for solar exposure from a fixed location, optimal aesthetic appeal, and minimal aerodynamic drag for transportation applications. Specific geometries combined with reflective substrates can effectively produce a combined PV film and solar concentrator.

There are many combinations of materials that may be used for the solar brush 10. One configuration is to use a Si thin film. Other configurations include CdTe/CdS (CdTe/CdS/SnO$_2$/Indium Tin Oxide(ITO)/glass), GaAs/GaInP, CuIn-GaSe$_2$, Cu(In$_x$Ga$_{1-x}$)(S,Se)$_2$, CuIn$_{1-x}$Ga$_x$Se$_{1-y}$S$_y$, CGSe/CdS, CuIn$_x$Ga$_{1-x}$Te$_2$/n-InSe, CdS/CIGS interface, ZnS/CIGS, Cu$_2$S—CdS, CuInS$_2$ or a mix of Cu$_x$S, CuInS$_2$ and CuIn$_5$S$_8$, Cu(In,Ga)Se$_2$/CdS, CIS/In$_2$Se$_3$, InN, CIS/In$_2$Se$_3$, ZnS$_x$Se$_{1-x}$, GaInP/GaAs, GaInP/GaAs/Ge, GaAs/CIS, a-Si/CIGS (a-Si is amorphous Si/hydrogen alloy), FeS$_2$, Cu$_2$O, ITO/a-CNx (Al Schottky thin-film carbon nitride solar cells), and MoS$_2$ based solar cells or more general: MX2 (M=Mo, W; X=S, Se) thin films with Ni and Cu additives layers may be used as well. An Al$_2$O$_3$ layer may be used as a diffusion barrier with the CuInGaSe$_2$ type PV cells. The manufacturing step may include heat annealing at high temperatures to allow for the consolidation of polycrystalline deposits to form a single crystal material or improve the structural integrity and regularity or geometry of the materials. Alternatively, single crystalline growth of layers should be favored by slow growth of the layers at moderate temperatures. Single crystalline deposits are important for optimum electron transport and photon absorption.

Deposition of the various materials can include chemical vapor deposition, solution phase deposition, electrochemical deposition, electrochemically induced sol-gel deposition, electrochemical atomic layer epitaxy, electroless deposition, e-beam evaporation, sol-gel with electrophoresis or centrifugation, electron beam lithography, scanned probe lithography, pressure injections, polymerization and electro-polymerization, and pyrolytic decomposition. Nanocables can also be grown from catalyst sites from chemical vapor deposition, wet or dry etched from a substrate, etc.

When designing a PV cell, one of the considerations is the photon flux. The number of photons that make it through the atmosphere at a given point remains relatively constant regardless of modifications in the PV cell that receives them. When determining the appropriate geometry for a PV cell, it is convenient to start by calculating the area of the gaps and the area of the bristle-tops.

Figure 4:
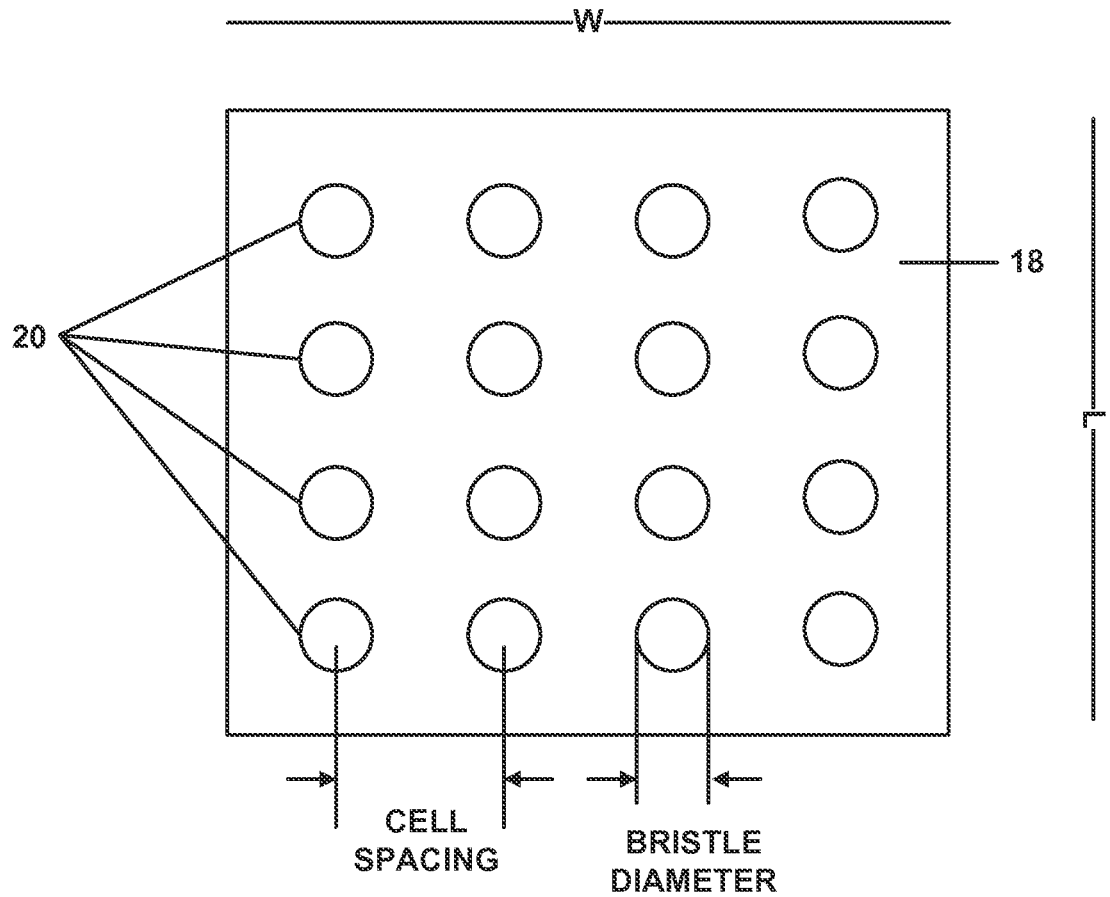
FIG. 4 is a top view of the solar brush showing the tops of the bristles.

FIG. 4 is a top view of the solar brush 10 showing the tops of the bristles 20. Although the bristles 20 are shown to be arranged regularly, this arrangement can be changed to suit the application. The tops of the bristles 20 have a combined area of $A_{top}$ which is calculated as $\pi(D/2)^2 \rho$ wherein D is the diameter of the bristle and $\rho$ is the cable density (number of cables/unit area). The total area ($A_{total}$) of the PV cell is W×L. The area of the gaps between the bristles can then be calculated using the following formula:

$$A_{total} = A_{top} + A_{gap}$$

During the same calculation, it is useful to determine if the spacing for a given cable density is viable for given geometries. When the diameter of the nanocable 22 ($D_{nanocable}$) is 50 nm, the minimum PV bristle diameter D is about 220 nm. When $D_{nanocable}$=150 nm, the minimum PV bristle optical thickness is about 320 nm. The physical diameter of the bristles 20 will be 100-500 nm larger than the diameter of the nanocable 22, but these numbers should be used for the optical diameter calculations because the outer shell is transparent. The optical diameter is used for calculating the solar efficiency, and the physical diameter is used for determining process limits.

One preferred density (p) range for nanocables is:

$$\rho = 31 - 10^9 \text{ pores/cm}^2 = 26^0 - 26^3 \text{ pores/m}^2$$

when using track etched membranes. When using metal oxide templates the density range shifts to:

$$\rho = 26^2 - 26^5 \text{ pores/m}^2$$

For the low density case, there is 1 cable per $10^{-10}$ m$^2$, or 1 cable in the center of a $10^{-5} \times 10^{-5}$ m square, so the separation between the center of cables is $10^{-5}$ m or 10000 nm. From that number, the diameter of the bristle from its center axis (which extends through the length of the nanocable 22) to the n-layer is subtracted. The spacing may not smaller than the cable and is preferably larger, so cases involving unrealistic physical spacing were eliminated from calculations in Table 1. Optical spacing, S, is given by the following:

$S$ = cable separation (center pt. to center pt.) − diameter a bristle (semitransparent material)

After Optical spacing is determined, the areas of the top of the PV bristles ($A_{top}$) as well as areas between the bristles ($A_{gap}$) are determined. Table 1 shows that majority of the planar surface area lies within the gaps of the PV cell, not the bristle tops. However, there are design points that have significant levels of top surface area.

TABLE 1

Planar area calculations for the PV brush.

| $A_{top}$ (m$^2$) | $A_{gap}$ (m$^2$) | $\rho$ (#/cm$^2$) | D (nm) | S (nm) |
|---|---|---|---|---|
| $3.00 \times 10^{-4}$ | 0.9996 | 31 | 220 | 9780 |
| $8.04 \times 10^{-4}$ | 0.9989 | 31 | 10 | 9220 |
| $3.80 \times 10^{-2}$ | 0.9620 | $10^8$ | 220 | 780 |
| $8.04 \times 10^{-2}$ | 0.9892 | $10^8$ | 10 | 220 |
| $1.90 \times 10^{-1}$ | 0.8100 | $5 \times 10^8$ | 220 | 227 |

Planar area and mass per area are crucial to determine back reflection. For planar cells, reflection bounces much of the light out of the PV cell before it has a chance to be absorbed and generate electricity. However, back reflection can benefit the planar cell by bouncing the light off of the back of the cell to give the cell two opportunities to absorb photons from the same stream of light. However, while the back reflection increases the number of absorptive events in the planar cell, it also increases the amount of heat generated per unit volume. In the case of the solar brush 10, only a fraction of the photons that hit the bristle tops can reflect away from the PV cell.

In many cases with the solar brush 10, over 96% of the light falls into $A_{gap}$. Several things happen to the light that falls into the gap: (a) the light is absorbed, (b) the light continues straight through the bristle into the next nearest bristle (as shown in FIG. 2), and/or (c) the light is reflected down into the solar brush at an angle of reflection equal to the angle of incidence. In each case, the light from the gap continues into the bristle. The majority of the light is either absorbed or continues straight through the brush. Back reflection is a function of material thickness as well as material type. Because the solar brush is made up of millions of thin bristles, they become nearly "transparent." Thus, in every case except Θ=90° (where Θ is defined as the angle of the sun relative to the plane of the PV cell substrate), back reflection is minimal. If it is assumed that 96% or greater light falls within the gap and each bristle has 90% transparency, then there is a maximum of 0.04% back reflection.

The depth and areas of penetrated light are also calculated. This is a measure of how uniformly the light can be dispersed throughout the PV brush. The penetration of light is governed by the following formula:

$$T_{pen} = \text{penetration thickness} = S \tan \Theta$$

The thickness or bristle height is related to the maximum penetration. The average penetration for a light stream in many cases would be about Θ/2. However, as Θ approaches 90°, the bottom of the cell could be theoretically flooded with light. However, in reality, this flooding effect is minimal or nonexistent because the light is affected by irregularities in the bristle geometry and can be eliminated by tilting the bristles slightly.

Table 2 shows how deep the light penetrates and what fractional area is used on a first pass by dividing $T_{pen}$ by T, which is the total bristle height. This is a measure of how much the initial light is being diluted. More dilute light leads to lower maximum temperatures or fewer hot spots in the cell, resulting in improved overall efficiency.

TABLE 2

Penetration percentage for a T = 10 μm cell as a function of sun angle above the horizon

| Spacing (nm) | Θ = 10° Penetration (%) | Θ = 45° Penetration (%) | Θ = 80° Penetration (%) | Θ = 90° Penetration (%) |
|---|---|---|---|---|
| 980 | 17.24 | 97.8 | 100 | 100.00 |
| 9220 | 17.07 | 96.8 | 100 | 100.00 |
| 780 | 1.38 | 7.8 | 8.24 | 100.00 |
| 220 | 1.20 | 6.8 | 38.56 | 100.00 |
| 227 | 0.40 | 2.27 | 12.87 | 100.00 |

Penetration percentage for a 100 μm cell as a function of sun angle relative to the plane of the PV cell substrate is simply 10 times lower. The penetration % is an important design criteria. For transparent cables, if there is 10% penetration, the light will have as few as 10 passes through PV cables, and the average photon would have up to 20 passes through the p-n junction since the photon may pass through the p-n junction twice per bristle. It is probably best to set design criteria to target less than 20% for most of the day to insure adequate absorption opportunities for the light stream. When Θ goes to 90°, tan Θ goes to ∞, temporarily making the penetration level 100%. Optimization, however, will be a function of field testing results.

The total PV absorption area is much greater for the sides of the bristles 20 than for the tops. $A_{cell}$ is the surface area available by PV brush which is given by:

$$A_{cell} = T(\pi)(D\rho/2)$$

where T is the height of the cable, D is the optical diameter of the PV bristle, and ρ is the number of bristles per unit area. The quantity is divided by 2 because it is assumed that most light absorption will come from the sun which is shining on half of the cell at one time. There will be significant absorption events from scattered light as well, but the majority of photons come directly from the sun. Table 3 summarizes some $A_{cell}$ calculations, and shows that the PV cell surface area increases rapidly with denser cell spacing and bristle height. "Cell spacing" is measured from the center of one bristle to the center of its neighboring bristle.

TABLE 3

PV Brush Area Calculations

| Height (μm) | PV Diameter (nm) | Cable Density (#/cm²) | $A_{cell}$ (m² Brush/m² planar) | Cell Spacing (nm) |
|---|---|---|---|---|
| 50 | 220 | 31 | 0.17 | 9780 |
| 100 | 220 | 31 | 0.35 | 9780 |
| 50 | 220 | $10^8$ | 17.28 | 780 |
| 100 | 220 | $10^8$ | 34.56 | 780 |
| 50 | 220 | $5 \times 10^8$ | 86.40 | 227 |
| 100 | 220 | $5 \times 10^8$ | 172.80 | 227 |
| 50 | 320 | 31 | 0.25 | 9220 |
| 100 | 320 | 31 | 0.50 | 9220 |
| 50 | 320 | $10^8$ | 25.13 | 220 |
| 100 | 320 | $10^8$ | 50.27 | 220 |

The penetration area is proportional to the penetration depth, as shown by the following formula:

$$A_{pen} = \text{area initially penetrated by light} = T_{pen}(\pi)(D\rho)$$

Where $A_{gap} \gg A_{top}$ the dilution of light is represented by the following formula:

$$A_{pen} = T_{pen}/T * A_{total}$$

From $A_{pen}$ and $A_{gap}$ (Table 1), a calculation that shows the amount of light dilution that occurs in the cell can be made. The light dilution is important to opportunities for solar absorption events and uniform heating. Wherever there are hot spots there is rapidly degrading conversion efficiency. Wherever there is concentrated light that tends to create hot spots, the ratio of opportunities for an absorption event to the number of photons decreases.

TABLE 4

Dilution levels for PV cells when the sun's angle is at 10°.

| Height (μm) | PV Diameter (nm) | Cable Density (#/cm²) | Cell Spacing (nm) | Dilution (times original area) |
|---|---|---|---|---|
| 50 | 220 | $5 \times 10^8$ | 227 | 15.23 |
| 100 | 220 | $5 \times 10^8$ | 227 | 30.47 |
| 50 | 320 | $10^8$ | 220 | 4.43 |
| 100 | 320 | $10^8$ | 220 | 8.86 |

Figure 5A:
FIGS. 5A-5H illustrate an exemplary method for fabricating the solar brush.

FIGS. 5A-5H illustrate an exemplary method for preparing the solar brush 10 including a metal substrate and bristles of CdTe and CdS. As shown in FIG. 5A, a substrate is prepared by sonicating with ultra pure water (e.g., 18 MΩ) and ethanol in an alternating manner. For example, a metal substrate may be sonicated with ultra pure water for 10 minutes, then with pure ethanol for 10 minutes, and this water-ethanol cleaning cycle may be repeated two more times. If desired, the cycle may be performed more or less than three times and/or an initial detergent-water, acid-water cleaning, or NaOH/NaCN/detergent electropolish process could be added. The type and amount of cleaning that is appropriate will be a function of how clean the substrate 12 is to begin with, and the type of material the substrate 12 is made of.

The substrate 12 may be a conductive material (e.g., metal) or a nonconductive material (e.g., glass or polymer) that is coated with a conductive layer.

Figure 5B:
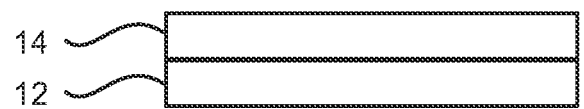

FIG. 5B illustrates the substrate 12 coated with the first conductive layer 14 that serves as the p-layer conductor in the PV cell. The first conductive layer 14 may be any well-known conductive material deemed suitable by a person skilled in the art, including but not limited to gold, copper, nickel, molybdenum, iron, aluminum, doped silicon, and silver. In one embodiment, a 500-nm layer of gold is evaporated on a glass substrate at 0.2 Å/s using an electron beam evaporator at a pressure under $5 \times 10^{-6}$ mbar at room temperature. In other embodiments, electroless plating is used with copper salts or $Na_3AuSO_3$ dissolved in 50 mM $H_2SO_4$. After metallization of the substrate 12, the surface of the first conductive layer 14 is rinsed with ultra-pure water (e.g., for 1 minute), rinsed with ethanol, and dried with nitrogen.

Figure 5C:
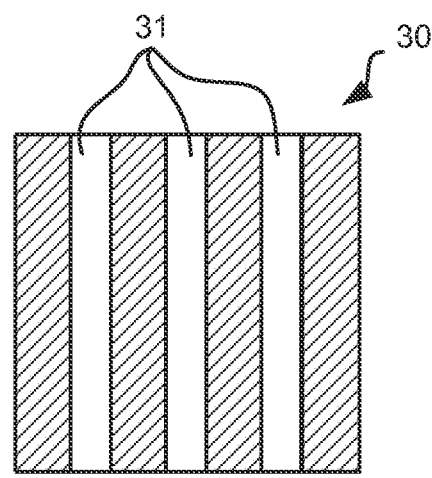

FIG. 5C illustrates a template 30 that may be used to form the bristles 20. The template 30 may be a membrane or porous structure that can be constructed on a conductive base, or the template 30 may be any of the commercially available nanoporous or micro-porous membranes, such as, for example, those made by Whatman Corporation under the trade names Nucleopore®, Anodisc® or and Black Cyclopore®. Track-etched membranes that have pore sizes in the range of 10 nm-5 μm are particularly useful. These track-etched membranes are typically made from polyethyleneterephthalate (PET) or polycarbonate (PC). Membranes may also be partially etched to deliver conical nanocables. Conical nanocables are thought to be significantly stronger than cylindrical nanocables but can be processed in a nearly identical way to the cylindrical nanocable. Selection of the membrane 30 depends on the particulars of the PV cell that is being fabricated. Different p/n combinations have different thickness requirements and therefore different cable size requirements. Before electrochemical deposition, the membrane 30 is cleaned and air bubbles expelled from the pores by submerging the membrane 30 in methanol and sonicating for 5 minutes.

Figure 5D:
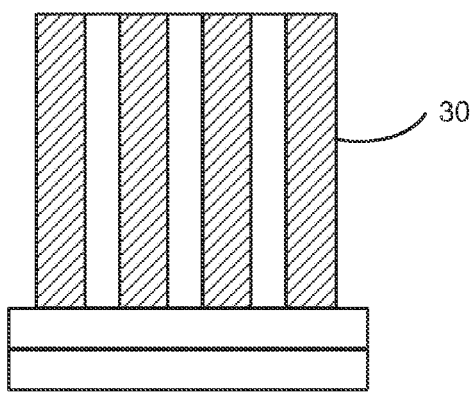

FIG. 5D illustrates the membrane 30 connected to the substrate 12 that has been coated with the first conductive layer 14. There are a number of ways to connect the membrane 30 to the conductive substrate 12 or the metallized nonconductive substrate 12. For example, a $TiO_2$ solution can be used as a conductive glue to fix the membrane to the surfaces. Alternatively, the membrane can be fixed using a Radionics Silver Conductive Paint®. Some substrates require no adhesion. The membrane is simply placed on top of the substrate provided there is good surface contact. Alternatively, the membrane could be attached to the surface with a clamp, using ultrasonic welding, or by fitting the surface and the membrane into a jig.

Figure 5E:
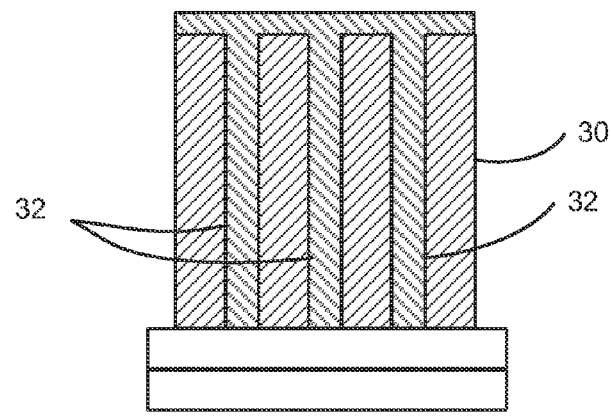

FIG. 5E illustrates the deposition of metal 32 into the membrane 30 and on the substrate 12. In an illustrative plating process, a Sn sensitizer is applied to the membrane 30 through a 5 to 45-minute immersion in 0.26M $SnCl_2$ and 0.07 M trifluoroacetic acid dissolved in a solvent having a molar ratio of 1:1 methanol to water. The membrane is rinsed with methanol. $Sn^{2+}$ adheres to the pore walls and outer surface of the membrane. Next, the membrane is immersed in an aqueous solution of 0.029 M ammoniacal $AgNO_3$ for five minutes. This causes a redox reaction where $Sn^{2+}$ is oxidized to $Sn^{4+}$ and $Ag^+$ is reduced to elemental Ag. Some silver oxide is also generated.

The pore walls and the membrane 30 become coated with discrete nanoscopic Ag particles. The membrane is rinsed with ethanol and immersed in water. Then the membrane is immersed in a 7.9 mM $Na_3Au(SO3)2$/0.127M $Na2SO3$/0.625 M formaldehyde solution that has a temperature of ~0° C. Gold plating is continued for 10 to 24 hours (time is dependant on pore size), at which time the nanocables are fully formed in the membrane.

An alternative way to deposit materials inside membranes entails using electrophoresis or centrifugation sol-gel methods, electrochemical atomic layer epitaxy, chemical vapor deposition, sputtering, E-beam evaporation, thermal evaporation, electron beam lithography, and scanned probe lithography. Alternatively, well known additives can be dissolved in the solution to impart nanocable strength or better electrical connections to the n-layer conductor. Preferably, metal covers all exposed areas of the membrane, substrate, and fills the pores. After the gold deposition, the membrane is soak with water and rinsed 4 times over a 3-hour period and immersed in 25% nitric acid for 12 hours to remove residual Sn or Ag. Finally, the membrane is rinsed with water and air dried. Evaporative metal deposition can also take place in the same manner as in FIG. 5B. One advantage of electroless or electro-deposition is that it does not require a clean room or high temperatures to deposit the metal on the substrate.

Alternatively, the membrane may be placed into the electroless plating solution by itself. The top, bottom, sides and pores become metallized. The membrane 30 may be glued as mentioned above to the metallized substrate 12.

If desired, atomic layer epitaxy may be used to build a protective cover over the membrane 30. Atomic layer epitaxy may be used as an alternative to electrochemical epitaxy.

Figure 5F:
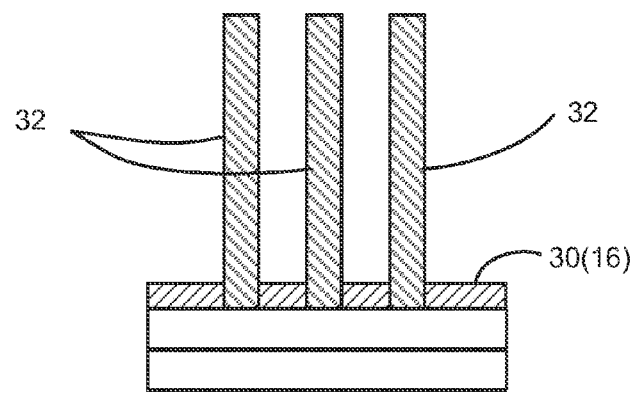

FIG. 5F illustrates the removal of the membrane 30, leaving the conductive cables (nanowires) 32 attached to the substrate 12. Membrane removal is most commonly done by solvent extraction. Partial membrane removal is often desirable. Layered membranes make it easier to achieve uniform partial dissolution. Generally, dichloromethane is used to not only remove the membrane but also the outer layer of metal leaving the nanocables. In some cases, the top conductive surface may be removed using ethanol to wipe out the excess after the membrane was coated but before it is immersed in 25% nitric acid. Tape can also be used to remove the outer metal, and may be used in conjunction with further cleaning steps. In some cases, it is possible to physically peel the membrane off.

Alternatively, the membrane itself can have the metal pre-deposited therein, or the metal can be deposited into the membrane prior to coupling with the substrate. The metal will fill the pores and coat the outer surfaces of the membrane. The membrane can then be glued with titanium dioxide or silver paste to the substrate prior to membrane dissolution.

As shown in FIG. 5F, the membrane 30 may be dissolved until adequate material is left to act as the insulating layer 16. Alternatively, the membrane may be completely dissolved and an insulating layer deposited using any suitable method such as spin coating, CVD, etc.

The insulating layer 16 may keep the current from the n-layer and p-layer from short circuiting. The insulator can also limit deposition of PV material to the nanocables. Because insulation eliminates the effects of defects of one cable from affecting its neighbors, processes like electroplating become feasible.

Electroplating is a desirable process because of low equipment costs and relatively good material conservation relative to other processes such as sputtering and CVD which deposit material throughout the chamber in addition to in the desired area. The thickness may easily be determined by using various exposure times to dichloromethane and verifying the membrane thickness with scanning electron microscopy.

If all of the membrane 30 is removed, excessive material is consumed. This process may be used if a thinner insulating material or a material other than the material the membrane 30 is made of is desired to form the insulating layer 16. In this case, the desired material may be spin-coated on the substrate 12 with polymethylmethacrolate (PMMA) to a thickness of about 1 μm. The PMMA may function as a membrane glue and/or an insulator. Any insulating material that can be applied to the PV cell be it polymers, silicone dioxide, or any insulator that can have adequate dimensional control during application. The PC membrane may be placed on top of the PMMA and baked at around 100° C. for about an hour.

In some embodiments, the insulating layer is eliminated altogether. As long as the p and n layers are adequately produced, direct contact with the conducting layers is possible.

In other embodiments, holes are made in the insulating layer after attachment of the membrane. For example, reactive ion etching (RIE) with oxygen and/or wet etching may be used to drill through the insulating layer 16 to allow the nanocables 32 to connect with the first conductive layer 14.

In other embodiments, membrane can actually be used as a masking layer to etch pores in the under layer, which is the insulating layer 16 in this case.

Figure 5G:
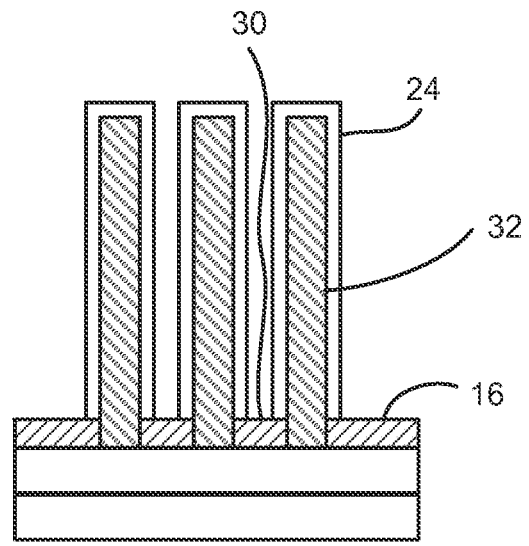

FIG. 5G illustrates the deposition of a p-type semiconductive layer 34. Where the p-type semiconductor is CdTe, for example, the electrochemical deposition is done using 50 mM $H_2SO_4$+1 mM $CdSO_4$+0.1 mM $TeO_2$ solutions deoxygenated with nitrogen prior to use at room temperature. The reference electrode may be Ag/AgCl/3 M NaCl and the counter electrode may be a gold wire. Ultra-pure (e.g., 18 MΩ) water rinses are performed between deposition steps with nitrogen drying. A thin layer of Te may be deposited to prevent Cd diffusion into the nanocable. When CdTe layer is deposited in an electrochemical cell from a solution of 0.5M $CdSO_4$ and $2.4 \times 10^{-4}$ M $TeO_2$ in water at a pH of 1.6 at 90° C., the optimum deposition potential for a stoichiometric film is −400 mV versus the Pt reference electrode. CdTe is also known to be deposited in ammonia solutions. Te deposition on the bristle surface can eliminate Cd diffusion into the core of the PV device. The CdTe layer also can be deposited by ECALE (electrochemical atomic layer epitaxy), ALD (atomic layer deposition in chemical vapor deposition system) or sol-gel. When non-electroplating processes such as CVD-related methods are used, etching can be used to remove the p-type layer 24 at the base of the structure to expose the insulation layer and create isolation between the nanostructures.

FIG. 5G also illustrates the deposition of an n-type semiconductive layer 36. Where the n-type semiconductor is CdS, CdS deposition is performed in 1.5 mM $SC(NH_2)_2$, 1.5 mM Cd $SO_4$, and 2 mM $NH_4OH$ heated to a temperature of about 40-70° C. Under these conditions, a 4.5 minute exposure would lead to a CdS layer of about 30 nm. The CdS layer also can be deposited by ECALE (electrochemical atomic layer epitaxy), ALD (atomic layer deposition in chemical vapor deposition system) or sol-gel. Again, when non-electroplating processes such as CVD-related methods are used, etching can be used to remove the p-type layer 24 at the base of the structure to expose the insulation layer and create isolation between the nanostructures.

Figure 5H:
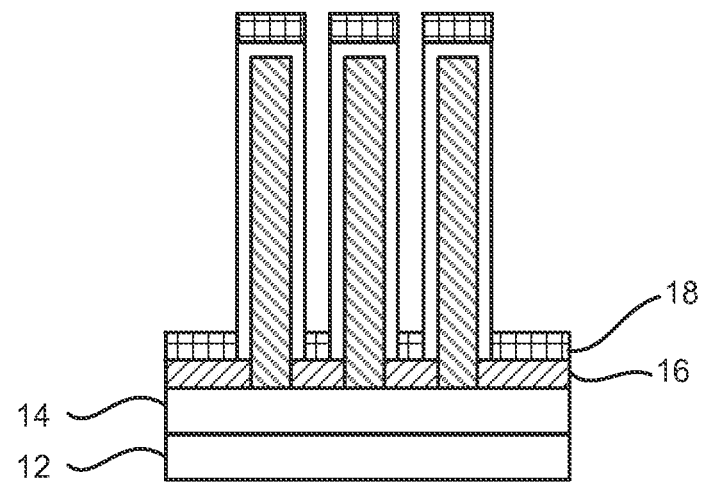

FIG. 5H illustrates the deposition of the second conductive layer 18 that completes the PV circuit. The second conductive layer 18 may be added using atomic layer epitaxy. This deposition connects the second conductive layer to the base of the n-conductors without contacting the nanocable. Alternatively, a thin layer of electroless metal can be coated as in the process illustrated in FIG. 5B as long as the metal remains thin enough to maintain adequate transparency. Yet another alternative is to apply a transparent conductive polymer such as poly(3-hexylthiophene) (P3HT), poly[2-methoxy, 5-(2-ethyl-hexyloxy)-p-phenylene-vinylene] (MEH-PPV), poly(phenylene vinylene) (PPV), and polyaniline to the outside of the nanocables to complete the circuit. The polymer could also provide additional structural support. Since the PV circuit is built on the nanoscale, penetration of the polymer may be challenging. For this reason, thinner solutions may be preferred. However, exposing the upper surface of the PV cell would provide adequate conduction. Preferred polymers are light and oxygen stable. Many different conductive polymers are useful to make the electrical contacts and are described in T. A. Skatherin, *Handbook of Conductive Polymers I*, which is incorporated by reference in its entirety.

Additionally, gel electrolytes may be used to make the electrical contact for the n-layer as shown in US2004/0025933, which is herein incorporated by reference. The electrolyte solution could be a combination of poly(4-vinylpyrimidine), poly(2-vinylpyrimidine), polyethylned oxide, polyurethanes, polyamides and a lithium salt. The salt could be lithium iodide, lithium bromide, lithium perchlorate, lithium thiocyanate, lithium trifluormethyl sulfonate, and lithium hexafluorophosphate to name a few.

Although FIGS. 5A through 5H illustrate an exemplary method of fabricating the solar brush 10, there are many suitable variations of the process. For example, an organic photovoltaic material could be used. For example, PV cells could be made based on Dr. Michael Grätzel and co-worker's technology developed at the Swiss Federal Institute of Technology. The metallic core of the nanobristle could be made of metal oxides based on Ti, Zr, Sn, W, NB, Ta, and Tb. The cables can then be coated with an organic dye such as xanthines, cyanines, mercocyanines, and phthalocianines, and pyrols. Many of these compounds have been tested by Konarka Corporation and have been developed for low temperature sintering as illustrated in patent application US 2004/00259934. Fortunately, the nanocable eliminates the sintering concerns and allows the organic compound to be easily applied and efficiently used on the surface of the nanobrush.

Also, any membrane with micropores can be applied to the substrate 12 to produce the PV brush. Also, any metal deposition should work with nanopores be it chemical vapor deposition, plasma vapor deposition, metal organic vapor deposition, electrochemical deposition (electrochemical epitaxy, under-potential deposition), liquid phase epitaxy, molecular beam epitaxy, hot wall epitaxy, sputtering, E-beam and thermal evaporation, electroless deposition, chemical bath deposition, sol gel and solution methods, vapor-liquid solid methods, sonochemistry methods, and microwave methods.

Nanoporous structures of certain metal oxides can be obtained with the metal anodization process instead of, or as a variation of, the method illustrated in FIGS. 5A-5H. Among other systems, Al, Ti, and transparent conductive oxides can be anodically oxidized to form a regular nanopore structure.

In one experiment, tin oxide was anodized. Before electro deposition, a thin Au film was sputtered on one side of the aluminum anodically oxidized (AAO) membrane to serve as the conductive layer. Electro deposition of Sn into the pores of the AAO membrane was carried out at a constant current density of 0.78 mA/cm$^2$ for 1 hour in electrolyte containing sodium tricitrate of 25 g/L and tin dichloride of 7 g/L. The Sn embedded in the AAO membrane was anodized at 10 V in 0.2 M boric acid, whose pH value was adjusted to 8.6 by 0.5 M NaOH(aq). The anodization proceeded until the current density dropped to almost zero. The AAO membrane was then removed through wet etching with 0.5 M NaOH(aq), leaving behind an array of nanoporous tin oxide nanorods. Finally, the samples were calcinated at 500° C. for 3 hours in air.

One embodiment of the present invention provides a method of forming nanoporous nanostructures. Using surface alloying, the nanostructure surface may be changed from smooth to rough. Nanoporous or nano-rough nanostructure obtained by this method is more robust because the nanoporous layer is confined to a few monolayers in the surface (not the entire bristle volume) and still maintains a plain metallic core.

To create a nanostructure with a rough outer surface, in one example, a thin film of (e.g., a monolayer of) Cd can be deposited on the surface of the gold bristles mentioned above. Electrochemical deposition of Cd is performed in the underpotential region (at potentials more positive than the Cd bulk deposition potential) for a few minutes and then the Cd layer is removed by switching the potential to more positive values. Stripping the Cd layer leaves a rough Au surface behind. After exposure to corrosive materials, the Cd dissolves, leaving a ragged but sturdy nanocable with a solid core. Electrochemical deposition of Cd is performed in the under-potential region (at potentials more positive than the Cd bulk deposition potential) for a few minutes and then the Cd layer is removed by switching the potential to more positive values. As before, stripping the Cd layer leaves a rough Au surface behind. The method can be applied to any alloy system that shows alloying at the interface (e.g. Pt-Me (Me=Ag, Pb, Sn, Hg); Au-Me (Me=Ag, Cu, Cd, Pb, Pd, Al, Hg, Sn); Ag-Me (Me=Cd, Pb).

In this example, Au nanocables array is the working electrode and the Electrochemical Adsorption-Desorption (ECAD) process is applied to the Au—Cd system. Electrochemical deposition of Cd is carried out at room temperature in 50 mM $H_2SO_4$+1 mM $CdSO_4$ solution, deoxygenated with nitrogen prior to use. All potentials reported here are relative to normal hydrogen electrode (NHE). The electrochemical deposition of Cd was performed at various potentials in the under potential deposition (UPD) region, i.e. from −0.3 to −0.49 V for various times. During deposition, the morphology of the surface does not change. Thus, the formation of the alloy will not deform the bristles and will not affect the nanostructure array. Stripping the cadmium layer by changing the potential to 0.19 V produces to a rough surface. Depending on the deposition conditions (in this case, potential and time), we can control the penetration depth of the alloy.

Tailored nanoporous metal nanostructures arrays created by the proposed method may also be suitable for sensor applications, particularly in a biomaterials context, catalyst and electrodes. The nanocable would be coated using the above-mentioned methods but would have at least 10× the surface area of the initial cables. Alternatively, smooth nanocable surfaces can be obtained by electrochemical annealing.

This method has several advantages. First, the electrochemical deposition of the subsequent layers (CdTe) can be performed in the same electrochemical cell; this eliminates the contamination during handling the sample (especially for nanostructures with huge surface area, contamination is the most important problem).

Second, the nano-rough nanostructure is more robust because the nanoporous structure is confined to a few monolayers in the surface (not the entire bristle volume) and still maintains a plain metallic core.

Third, the roughness of the surface can be controlled within a few nanometers (which is in fact the surface layer for a cylinder with a diameter of 100 nm) by varying the deposition conditions so the cable can be made rough while maintaining structural integrity.

Fourth, upon subsequent conformal deposit layers of CdTe and CdS, and finally TCO or polymer, the porous structure is further strengthened. The final advantage is that multiple reflections (the light is trapped into the nano-size cavity of a bristle and will have several reflection before it is reflected into the neighbor bristle) increases the efficiency of light absorption.

The Cd/Au method is particularly robust.

The bristles 20 may be shaped to increase the surface area. For example, the bristles 20 may have "branches" or holes in the nanocable. Holes may be created by depositing the Cd/Au alloy as just described and anodizing.

As another alternative to the method of FIGS. 5A-5H, the solar brush 10 may be prepared using a reverse-nanocable fabrication method that is illustrated in FIGS. 6A-6F, where the nanocable is formed as one of the last steps. In the reverse-fabrication method, the nanocables are prepared after one of the conductive layers, unlike in the method of FIGS. 5A-5H. Titanium isopropoxide may be used as the precursor molecule for the sol-gel preparation of the $TiO_2$ nano structures.

Figure 6A:
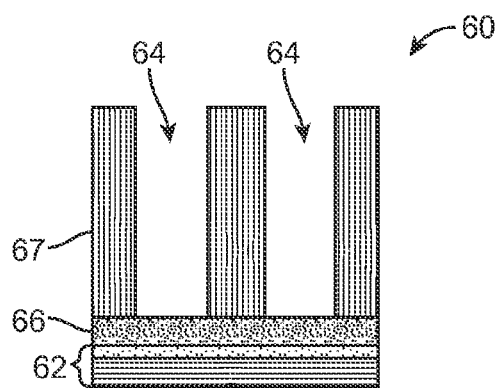
FIGS. 6A-6F illustrate an alternative method for fabricating the solar brush.

FIG. 6A illustrates a template membrane 60 that may be used for the reverse-fabrication method. The template membrane 60 has a substrate 62 (e.g., soda lime glass). The template membrane 60 is obtained by coating the substrate 62 with a high-purity aluminum layer. A transparent oxide layer is formed using a two-step anodization process: depositing on the aluminum layer, and forming porous aluminum layer columns 67. Substantially all of the high-purity aluminum layer that is coated on the substrate is oxidized to form the aluminum layer columns 67. The area between the porous aluminum columns 67 are pores 66 of the template membrane 60. A conductive or semiconductive layer 66 is deposited on the substrate 62.

Figure 6B:
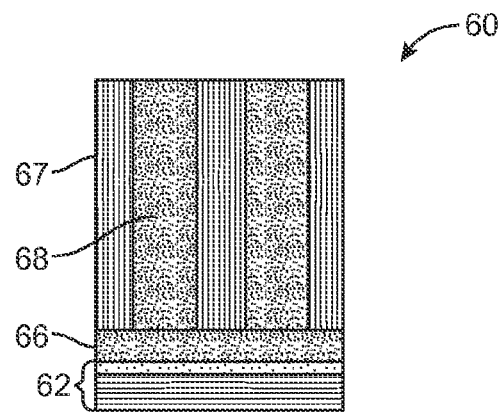

FIG. 6B illustrates the sol gel deposition of transparent conductive oxide in the pores. Sol gel deposition can be performed in either attached or detached porous membrane. First, titanium isopropoxide is dissolved in 95% ethanol to yield a concentration of typically 20 v/v %. A second solution is then prepared by mixing 25 mL of ethanol with 0.5 mL of water and 0.5 mL of 0.1 M HCl. Equal volumes of the titanium isopropoxide solution and the second solution are then combined to yield the $TiO_2$ sol. The template membrane 60 is then dipped into this sol for the desired amount of time, removed, and allowed to dry in air for 30 min. The sol-containing membrane is then heated in air at 400° C. for 24 hours. This procedure yields $TiO_2$ tubules or fibrils within the pores and $TiO_2$ films on both faces of the template membrane. Electrophoresis and centrifugation can be applied in order to obtain a denser nanostructure. A transparent conductive oxide pillar 22 is formed of any conductive oxide material or, for example, Ti with a conductive oxide material formed thereon by plasma vapor deposition PVD.

Figure 6C:
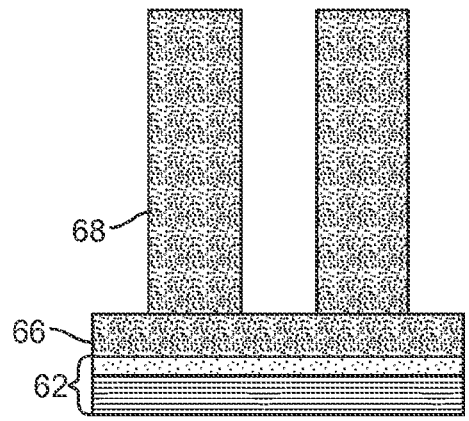

FIG. 6C illustrates the removal of the porous aluminum columns 67 of the template membrane 60. The surface films can be removed by polishing the template membrane 60 with 1500 grit sand paper or nanoscale milling using ultrashort laser pulses or other wafer fabrication milling techniques. If desired, the alumina template membrane 60 can then be dissolved away by immersion in aqueous base to expose the synthesized TiO2 pillars 22.

Figure 6D:
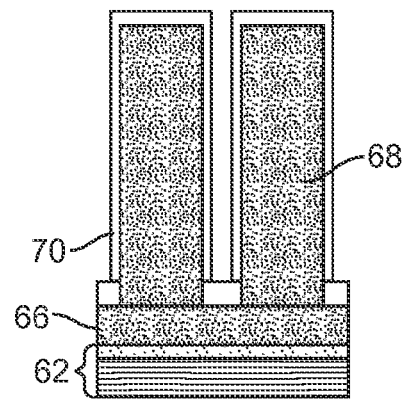

FIG. 6D illustrates the deposition of a n-type semiconductor layer 70 over the pillars 22. The n-type semiconductor layer 70 may contain CdS, which may be electrochemically deposited. CdS is also deposited on the conductive oxide layer 66 between the pillars 22.

Figure 6E:
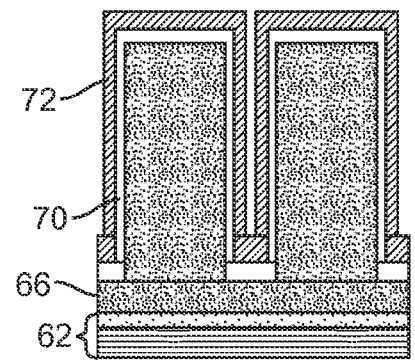

FIG. 6E illustrates the deposition of a p-type semiconductor layer 72 over the n-type semiconductor layer 70. The p-type semiconductor layer 72 may contain CdTe, which may be electrochemically deposited. CdTe may also be deposited in the areas between the CdS layers.

Figure 6F:
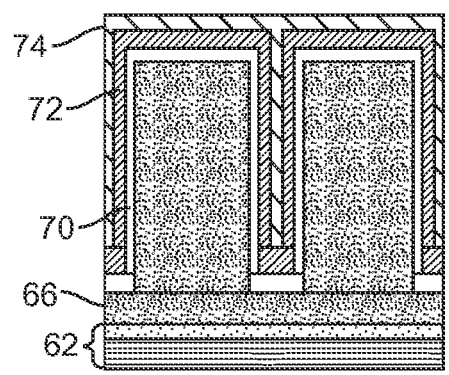

FIG. 6F illustrates an electroless deposition of a metal contact 74. The metal contact 74 fills the gaps between the CdTe layers, thereby forming the nanocable, which in actuality may appear as a lattice. This process may be especially beneficial for formation of Au and Cu nanocables at extremely high aspect ratios.

To create an insulating layer in between nanocables, the top metal contact 74 can be removed to expose the composite surface made of conductive nanowire and p layer. Then, the p layer and n layer can be selectively etched leaving the conductive nanowires sticking out the top surface. Then, an insulating layer can be applied and the surface is then polished to result in a composite surface made of conductive nanowires and insulating layer. Then, a conductive layer is applied which will create the contact with the nanowires.

If the aspect ratio is too great, softer nanocables may collapse under their own weight. Tall Au or Cu nanocables may be fragile, and their strength may be increased by alloying Au with other metals or by reinforcing the gold with a hard metal coating. FIGS. 7A-7H illustrate a hard-metal reinforcement process that may be used to strengthen the fragile nanocables. Any hard metal (such as nickel or molybdenum) that works at high temperatures may be used for the metal reinforcement. However, in the interest of clarity, FIGS. 7A-7H will be described using nickel as the reinforcement metal.

Figure 7A:
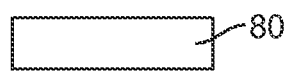
FIGS. 7A-7H illustrate a hard-metal reinforcement process that may be used to strengthen fragile nanocables.

As shown in FIG. 7A, the metal reinforcement process begins by providing a substrate 80. The substrate 80 is metallized by deposition of a first conductive layer 82, as shown in FIG. 7B. Preferably, the substrate 80 is of the same base metal as the nanocable core to facilitate physically strong junctions at the base of the cable as well as to provide good conductivity. The first conductive layer 82 may have a height of h, as shown. The first conductive layer 82 may be, for example, 99.99% pure aluminum. Then, as shown in FIG. 7C, the first conductive layer is oxidized under controlled temperature and voltage to form a metal oxide porous membrane 85 of a preselected shape having a pore 85. Since not much growth occurs during oxidation, the height of the metal oxide porous membrane 85 remains at approximately h. If desired, an appropriate commercial membrane may be used instead of forming the metal oxide membrane 85.

Figure 7E:
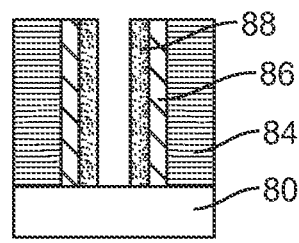
Figure 7B:
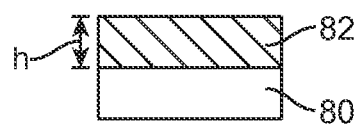
Figure 7F:
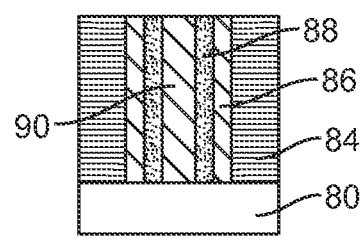
Figure 7C:
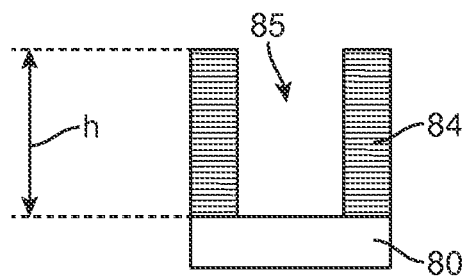
Figure 7G:
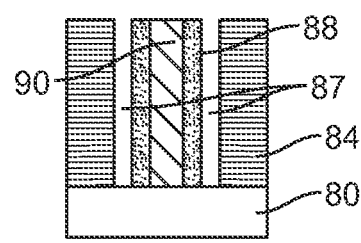
Figure 7D:
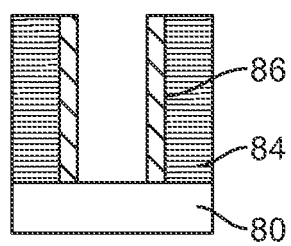

FIG. 7D shows that the metal oxide porous membrane 85 template is exposed to ethylene in an argon environment at a temperature of about 190-780° C. to form carbon nanotubes 86. The exposure may be done by placing the "template" made of the substrate 80 and the membrane 85 in a heated chamber and adding ethylene to the chamber. Initially, the carbon layer is formed on top of the metal oxide membrane 85 as well as on the base and the inner walls of the pore 85. The carbon layer is, however, removed from the top of the metal oxide membrane 85 and the base of the pore 85, leaving carbon nanotube 86 as shown in FIG. 7D. Etching (e.g., RIE or wet etching) or polishing may be used to remove select portions of the carbon layer. The carbon nanotubes 86 are formed along the inner sidewalls of the metal oxide membrane 85.

Figure 7H:
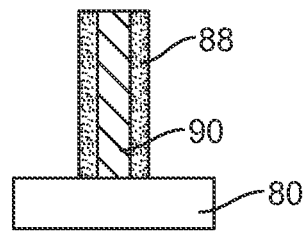

FIG. 7E shows nickel deposition, which may be done by electrolytically plating the nickel on the carbon nanotube 86. After deposition, the nickel is heated in air to 400° C. to form a nickel oxide nanotube 88. The nickel nanotube 88 is then be filled with a core metal 90, such as gold or copper, as shown in FIG. 7F. As shown in FIG. 7G, the template and the nanotubues are exposed to air at 600° C. to burn away the carbon nano tube. As shown, removal of the carbon nanotube 86 leaves a gap 87 separating the nickel-enforced core metal 90 from the metal oxide membrane 85. In FIG. 7H, the metal oxide membrane 85 (in this case aluminum oxide) is removed, for example by being dissolved in sodium hydroxide. A nickel-enforced nanocable 88+90 remains.

If desired, the gap 87 (see FIG. 7G) may be filled with a photovoltaic polymer (e.g., an organic polymer) or titanium dioxide. The size of the gap 87, which is determined by the size of the carbon nanotube 86, controls the diameter of the nanocable that ultimately forms. Especially if the gap 87 will be filled with a material that forms the outermost wall of the nanocable, the size of the gap 87 is important in that it determines the thickness of the outermost wall.

Figure 8:
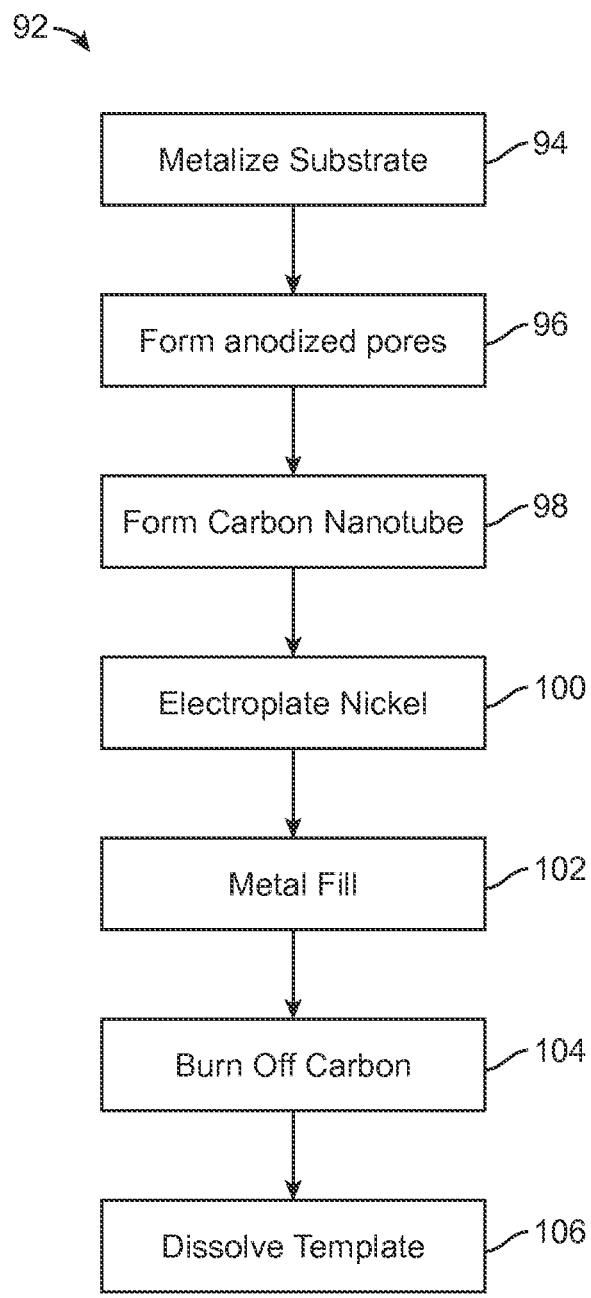
FIG. 8 is a flowchart summarizing the steps of the hard-metal reinforcement process of FIGS. 7A-7H.

FIG. 8 is a flowchart summarizing the steps of the hard-metal reinforcement process 92 that is schematically illustrated in FIGS. 7A-7H. First, the substrate is metallized (step 94) by deposition of a conductive layer. A membrane with anodized pores is formed on the metallized substrate (step 96), and carbon nanotubes are formed on the membrane (step 98). A hard metal such as nickel is electroplated on the carbon nanotubes (step 100) so as to form a cavity in the core. The core is then filled with a core metal such as gold or copper (step 102) to form the nanocable. The carbon nanotube is then removed (step 104) and the template is dissolved (step 31) to leave the metal-enforced nanocable.

If the core metal is gold, which may be too soft, copper nanotube may be formed on the nickel nanotube or instead of nickel nanotube to form a reinforcement for the gold nanocable.

Figure 9A:
FIGS. 9A-9H illustrate a dimension-controlling process for forming the nanocables.
Figure 9B:
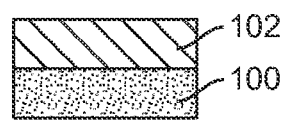
Figure 9C:
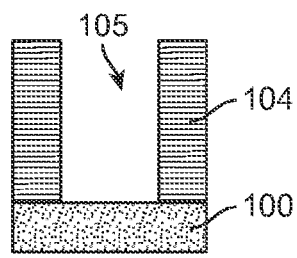
Figure 9D:
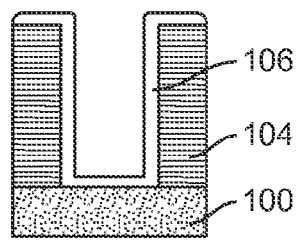
Figure 9E:
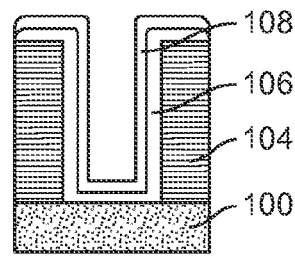

Nanocables may also be strengthened by a more precise control of their dimension, as shown in FIGS. 9A-9H. As in the metal reinforcement process of FIGS. 7A-7H, a substrate 100 is provided (FIG. 9A) and metallized (FIG. 9B) by adding a conductive layer 102, which may be 99.99% pure aluminum. An oxide template 104 having a pore 105 is produced (FIG. 9C) by oxidizing the aluminum under controlled conditions. Substantially all of the conductive layer 102 turns into the oxide template 104. Then, as shown in FIG. 9D, a first polymer is deposited on the surface and cured to form a first polymer thin film 31. The polymer deposition (e.g., by inkjet coating) and curing may be performed any number of times to form as many polymer thin films as desired. In FIG. 9E, a second layer of polymer is deposited and cured to form a second polymer thin film 108.

Figure 9F:
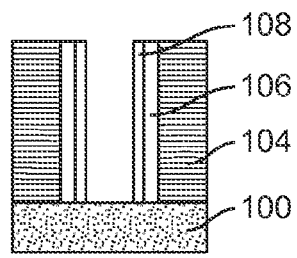
Figure 9G:
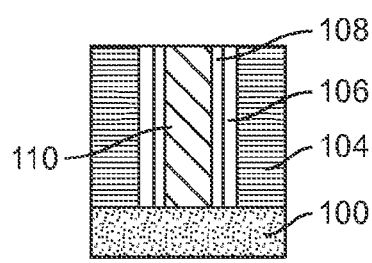
Figure 9H:
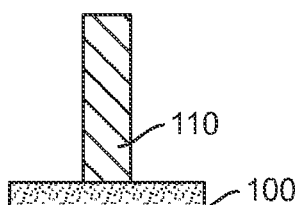

As shown in FIG. 9F, the polymer thin films 31, 108 on the top of the membrane and the base of the pore are removed. Next, electroless or electrochemical deposition of metal can take place inside of the pore 105 (FIG. 9G). A solvent extraction removes the polymer thin layers 31, 108 and a NaOH extraction removes the metal oxide template 104 to leave a precisely designed nanocable (FIG. 9H). Polymers such as poly(3-hexylthiophene) (P3HT), poly[2-methoxy, 5-(2-ethyl-hexyloxy)-p-phenylene-vinylene] (MEH-PPV), poly (phenylene vinylene) (PPV), and polyaniline may be used as the polymer thin layers 31, 108. Additionally, any suitable polymer from the *Handbook of Conductive Polymers I* by T.

A. Skatherin or the *Handbook of Polymer Coatings for Electronics Chemistry* by J. J. Licari and L. A. Hughes may be used.

Figure 10:
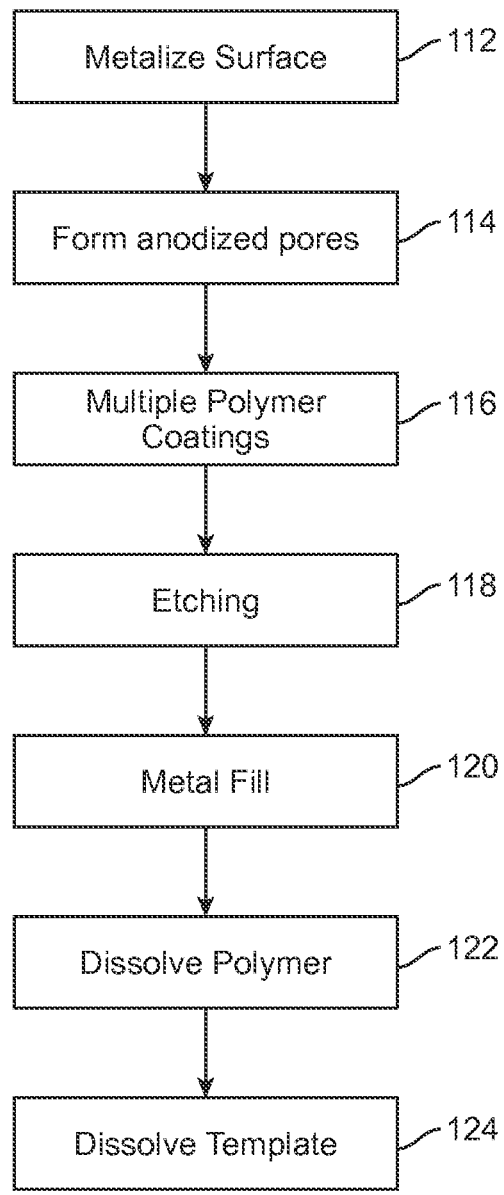
FIG. 10 is a flowchart summarizing the steps of the dimension-controlling process of FIGS. 9A-9H.

FIG. 10 is a flowchart summarizing the steps of the metal reinforcement process illustrated in FIGS. 9A-9H. First, the substrate is metallized (step 37) by deposition of a conductive material on its surface. A membrane (a template) is formed on the metallized substrate, and the membrane has a pore of the desired size and shape that is anodized (step 114). One or more polymer layers are deposited and cured (step 116). The polymer layers on horizontal surfaces, such as the top of the template and the base of the pore, are removed by reactive ion etching (step 118). The pore is filled with a core metal such as gold or copper (step 45). Then, the polymer layers are dissolved (step 122) and the membrane is removed by solvent extraction (step 124).

Figure 11A:
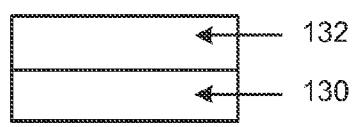
FIG. 11A-11I illustrate the carbon jacket process for producing organic nanocables.
Figure 11B:
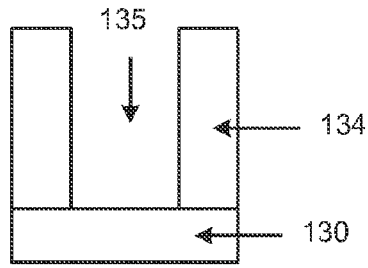
Figure 11C:
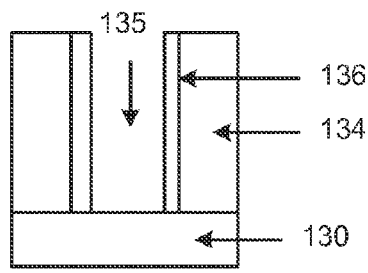
Figure 11D:
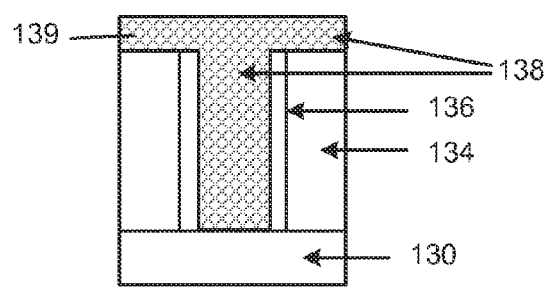
Figure 11E:
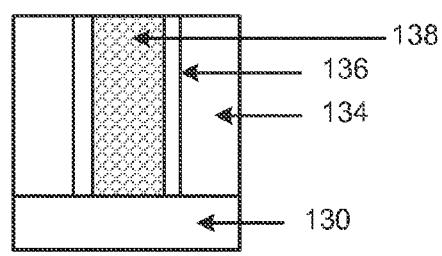
Figure 11F:
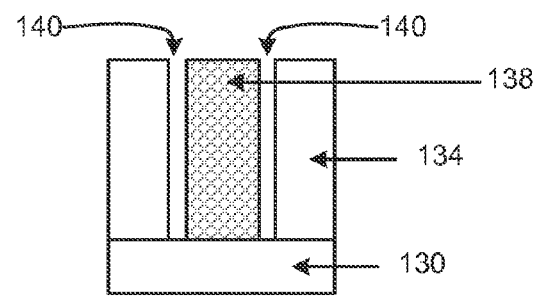

FIGS. 11A-11I illustrate that organic nanocables may be produced using a carbon jacket process. FIG. 11A shows a substrate 130 with a conductive layer 132 deposited on its surface. In the same manner as described above in reference to FIG. 7C, a metal oxide membrane 134 is formed, wherein the membrane has a pore 135 of the desired shape and size (FIG. 11B). As shown in FIG. 11C, carbon nanotubes 61 are formed on the inner wall of the pore 135 in a manner similar to what is described above in reference to FIG. 7D, and titanium dioxide 138 is used to fill the remaining core portion of the pore 135 (FIG. 11D). As shown, titanium dioxide 138 fills the pore 135 and "overflows" to form a cap 139 above the carbon nanotube 61 and the metal oxide membrane 134. The cap 139 of the titanium dioxide 138 is removed in FIG. 11E, for example by any suitable etching method such as concentrated $H_2SO_4$ etch.

Figure 11G:
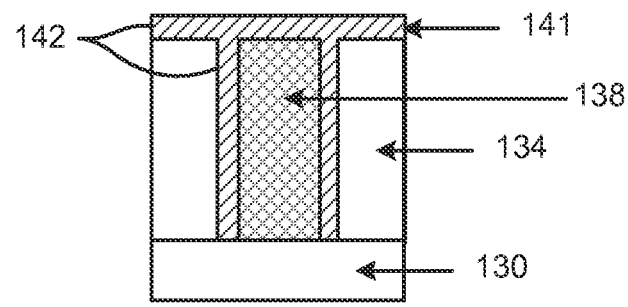
Figure 11H:
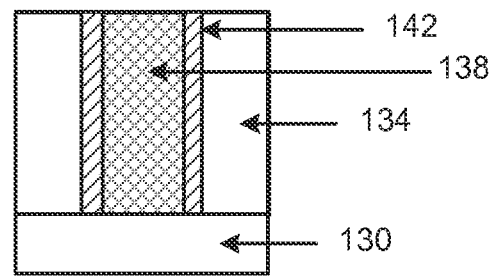
Figure 11I:
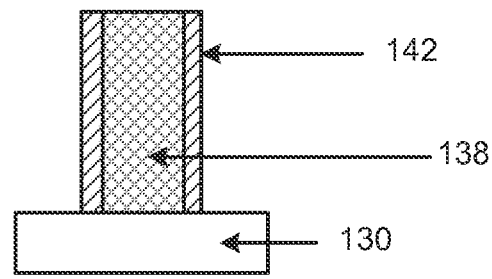

With the titanium dioxide cap 139 removed, the carbon nanotube 61 is burned off by exposure to air at about 600° C. (FIG. 11F), forming a gap 140 between the titanium dioxide core 138 and the metal oxide membrane 134. An organic Grätzel dye 142 is then deposited to fill the gap 140 and form an organic cap 15 (FIG. 11G). Polymers such as poly(3-hexylthiophene) (P3HT), poly[2-methoxy, 5-(2-ethyl-hexyloxy)-p-phenylene-vinylene] (MEH-PPV), poly(phenylene vinylene) (PPV), and polyaniline, or any other suitable polymers from *Handbook of Conductive Polymers I* may be used with the Grätzel dye 142 as conductors. The organic Grätzel dye 142 can be sprayed with an inkjet printer, applied with a rotogravure process, sprayed on and wiped with a doctor blade, etc. The most suitable applications leave the minimum organic cap 15. Following this preliminary removal, the organic cap 15 may be etched (e.g., with RIE) or removed with a solvent wash to complete the removal process (FIG. 11H). Then, the metal oxide membrane 134 is removed, for example by wet etching with a carefully selected etchant (e.g., NaOH) that preferentially removes the metal oxide over titanium dioxide (FIG. 11I). In some embodiments, the metal oxide membrane 134 is made to be transparent so that its removal is not needed.

Figure 12:
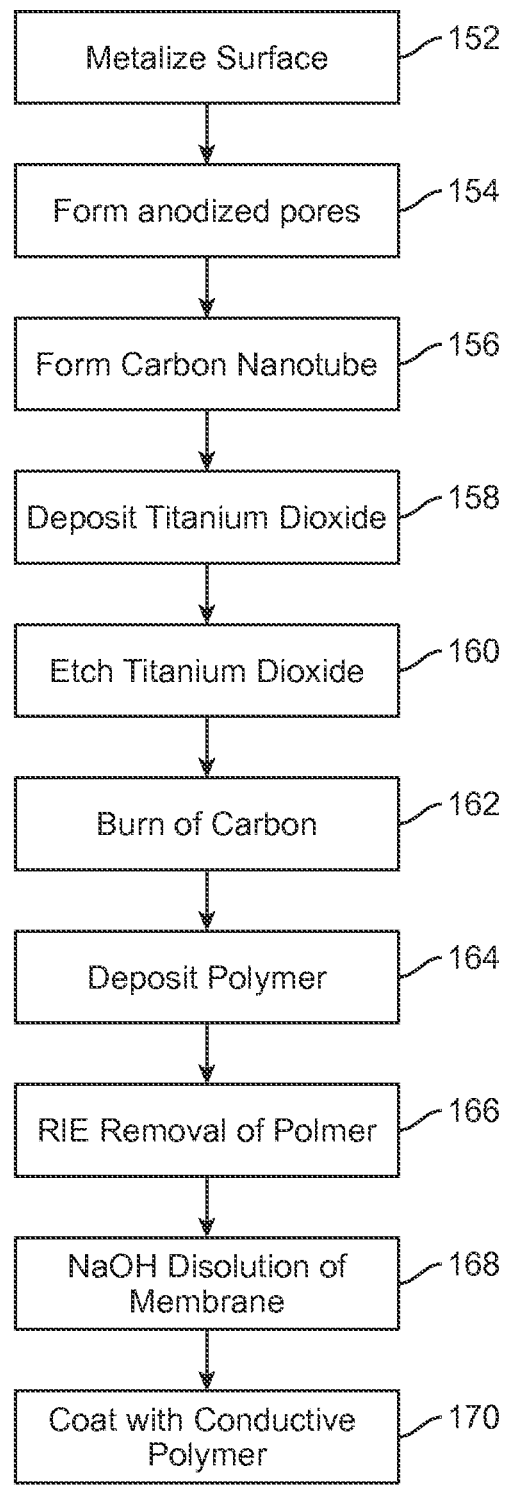
FIG. 12 is a flowchart summarizing the steps of the carbon jacket process of FIGS. 11A-11I.

FIG. 12 is a flowchart summarizing the carbon jacket process illustrated in FIGS. 11A-11I. As shown, a substrate surface is metallized if needed (step 152). Anodized pores are formed by preparation of the metal oxide membrane on the substrate (step 154), Then, carbon nanotubes are formed on the walls of the anodized pores (step 76), and titanium dioxide is deposited in the remaining core portion of the pores (step 158). Any titanium dioxide that flowed over and formed a titanium dioxide cap is removed by etching (step 160), exposing the carbon nanotubes. The carbon nanotubes are burned away (step 162), leaving a gap between the titanium dioxide and the metal oxide membrane. An organic polymer is deposited to fill this gap (step 166), and any organic polymer that overflows and forms a cap is removed, for example by wet or dry etching (step 166). The metal oxide membrane is then dissolved with NaOH (step 122). The resulting nanocable has a titanium dioxide core reinforced with an organic polymer. This nanocable may be coated with a conductive polymer (step 170) that serves as the n-type conductor.

Figure 13A:
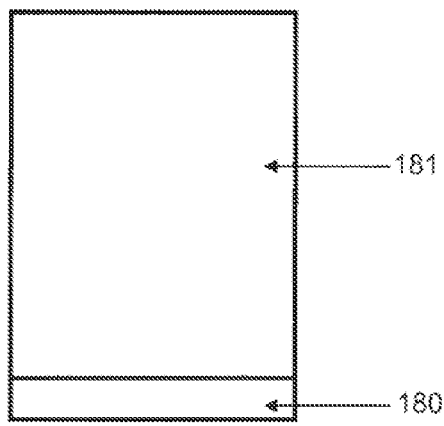
FIG. 13 A-E: illustrates the insulator etching process.
Figure 13D:
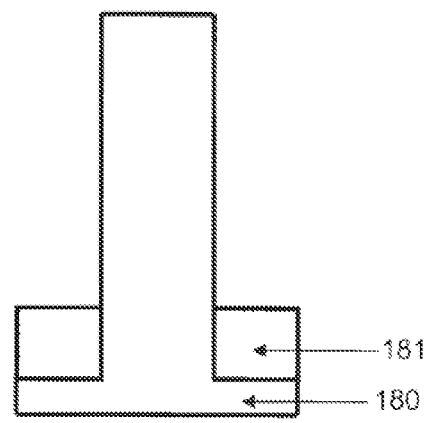
Figure 13B:
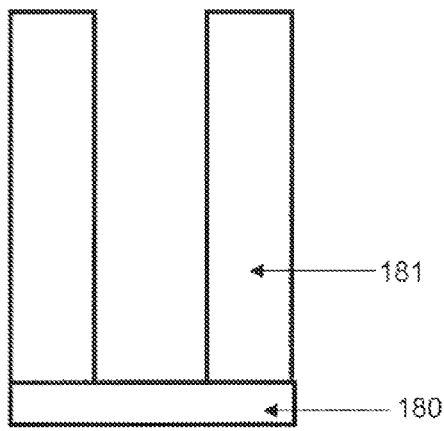
Figure 13E:
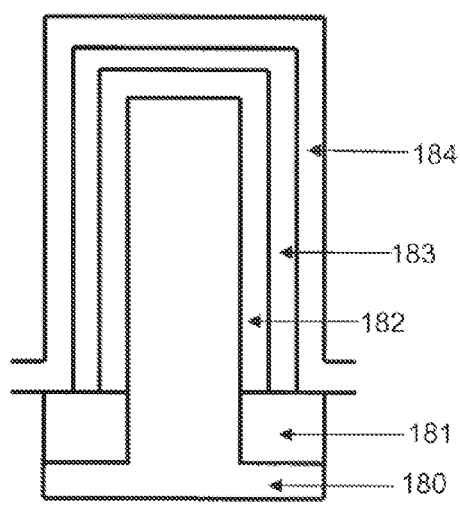
Figure 13C:
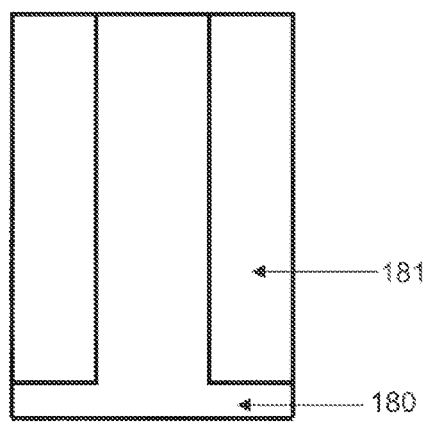

FIG. 13A shows an insulator 181 deposited on a conductor 180. The insulator can be any insulating material such as metal oxide, silicone dioxide, or polymer. The insulator can be applied through CVD or sputtered. It can also be anodically grown from metal deposited on the conductor 181. FIG. 13B shows how the insulator can be wet or dry etched to form a pore that continues through to the conductor 180. FIG. 13C shows that the conductor can then be deposited through electroplating or the electroless deposition methods contained herein. FIG. 13 D shows the conductor partially etched. In the case of silicone dioxide, a KOH solution can be used for etching, in the case of polymers, dichloromethane may be used. FIG. 13E shows the completed nanocable with the p-conductor 180, the insulator 181, the p-layer 182, the n-layer 183, and the TCO 184.

Figure 14:
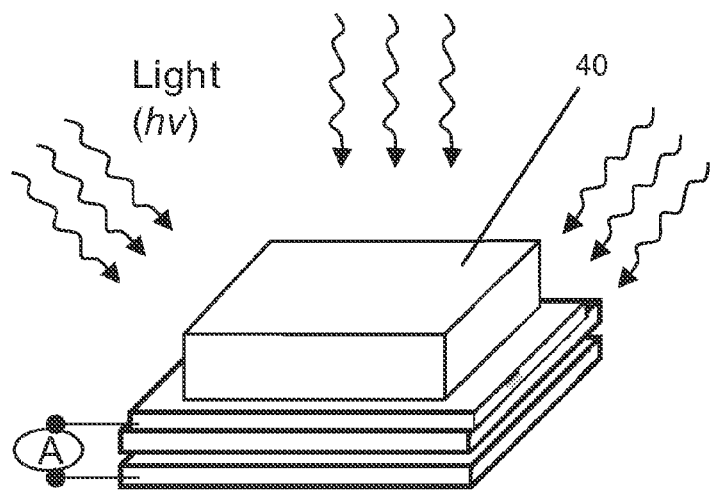
FIG. 14 shows the solar brush encapsulated in an optical casing for protection.

FIG. 14 shows the solar brush 10 encapsulated in an optical casing 40 for protection from various environmental elements. The optical casing 40 may also be made of a transparent polymer. The optical casing 40 may be made of film conductive oxides that allow light in but minimize soil and moisture contamination. Common materials for this application include Sn doped $Sn_2O_2$, Sn doped $In_2O_3$, $ZnSnO_3$, B doped ZnO. F doped $In_2O_3$, F doped $SnO_2$, F doped $Cd_2SnO_4$, F doped ZnO, TiN, Ag, $Cd_2SnO_4$, Ge doped $In_2O_3$, Ge doped $SnO_2$, Ge doped $Zn_2SnO_4$, ZnO/CdS, ZnO/ZnSe (for CdTE and $CuInSe_2$), $ZnO/In_xSe_y$ (for CdTE and $CuInSe_2$), $SnO_2$/glass, ZnO/CdS, $Cd_2SnO_4/Zn_2SnO_4$, Zn(Se,OH), Zn(Se,O), and $Cd_2SnO_4/Zn_2SnO_4$. For additional conductivity small wires or metal strips or thin bands of metalized glass can be added for additional conductivity. Metal should be minimized to reduce reflection but be sufficient for adequate conduction of electricity. Traditional casing of low-iron glass and extruded aluminum may also be used as in the case of created a module of a form compatible with existing PV modules.

In some embodiments, a back contact is employed. The back contact could be especially useful for bi-layered photovoltaic cells to reflect the photons from a high band gap materials at the top of the cell to low band gap materials at the bottom of the cell. The reflection still allows light have single passes through the PV material from reflections. Where a reflective back contact is used, the optical reflector may include $Sb_2Te_3$, Ni, $NiTe_2$, and Te/CdTe.

Soil build up might eventually reduce the effectiveness of the solar cell. Fluorosilicone polymers would greatly reduce soil adhesion and allow maximum cleaning during rain storms. Additionally, any thermally stable material that exhibits the Lotus effect (low surface are for particulate adhesion) may be used to keep dust off of the PV cell.

To aid the maintenance of the solar cells, an LED or liquid crystal display could indicate power output of solar cell, or operations of PV cell units so that malfunctioning cells could be easily identified and replaced. As mentioned above, there are numerous advantages of the solar brush 10 over conventional PV cells. The solar brush 10 demonstrates a high thermal stability. Unlike nanoparticles, where the linear thermal expansion coefficient increases with the reduction of the average grain size (Cu, for instance), Cu nano-wires show a smaller thermal expansion coefficient than that of the bulk Cu. The high thermal stability is related to the grain boundary structure and high aspect ratio of the nanostructure. Daisy chain connections may also combat potential thermal expansion/contraction issues by minimizing chip size and then connecting them opposed to having a large sheet that would have a higher potential for stress cracking due to thermal expansion contraction. Daisy chains between cells could also add flexibility to a PV brush array. To accomplish this, the cells may have special interlocking mechanism to serve the dual purpose of a being a robust carrier of the film during processing and to speed assembly.

Because the method describes growth of conductors on a conductive sheet, the failure rate that plagues current PV cell manufacturing will be greatly improved giving further cost/efficiency advantages.

A further advantage of the PV brush is that the distance electrons diffuse through the semiconductive layer to the conductive layer is shorter than that of conventional PV cells thereby reducing internal resistance of the PV cells to deliver further power generation efficiencies. Because the PV bristles are thin, they use a small fraction of the material required for planar cells. A variety of organic and inorganic semiconductors can be applied to the conductive core and thicknesses can easily be optimized for power generation and stability.

Besides solar panels, nanoelectronic assemblies can also be used for light generation in optical chips. Optical chips are widely thought to be the replacement for semiconductor chips. Optical chips have narrow pathways that light can travel unhindered while semiconductor chips are limited by electric field effects between on circuit and the next. A micro light source with unique color attributes could be essential for optical chip technologies. The nanoelectric assemblies can also be used as a nanolight source for such chips. Additionally, the nanodiodes can be used in a flat screen display for an ultra sharp video monitor. Additionally, the nanodiodes can be used for very energy efficient lighting.

The PV brush has flexible manufacturing options including membrane manufacturing technologies or photolithography e-beam, low density layered mechanical scoring, nanoporous templated, electroplating, and electrical arcing. These manufacturing methods can be used on a variety of membrane/nanoporous media which allows cell to be shaped and hardened to geometry that has maximum solar efficiency, maximum aerodynamic efficiency, maximum aesthetic appeal or a combination of the aforementioned attributes. Flexible units can also be achieved by daisy chain connection between small rigid units or from the use of a flexible substrate. At high temperatures, uneven thermal expansion can cause cracking and wear as well. High temperature degradation is mitigated because each component of this PV cell can be sized to minimize thermal expansion and can be further optimized with flexible expansion joint conductive connections between PV arrays. Additionally, the greater surface area of the solar brush will reduce thermal heat generated under the PV solar cell compared to the conventional flat unit which could greatly reduce unwanted heat buildup. One further advantage is that micro conductors often have reduced resistance at higher temperatures; therefore, the PV brush could be able to transfer energy more effectively than conventional PV cells at higher operating temperatures.

Finally, the geometry can be used to trap or release heat. If heat were found to be detrimental to energy above a certain point, the unit could be designed with vents. However, it should be noted that performance of nanocables may be different that than large scale wires. While large scale wires/cables have higher resistance to electrical flow at high temperatures, energy flow may improve due to improved flow through grain boundaries in nano-scale structures.

Power generation is a function of average power per day. The median sun hours for various cities in California is 6.18 kW/(day*m$^2$) according to a Go Solar® Company web page at www.solarexpert.com/Pvinsolation.html. On average, solar energy is drawn from about 6 hours per day based on the data made publicly available by National Renewable Energy laboratory findings. The distribution is commonly given as a Gaussian curve, which has the following distribution:

$$f(x) = \frac{e^{\left(\frac{-(x-\mu)^2}{2\sigma^2}\right)}}{\sigma\sqrt{2\pi}}$$

Figure 15:
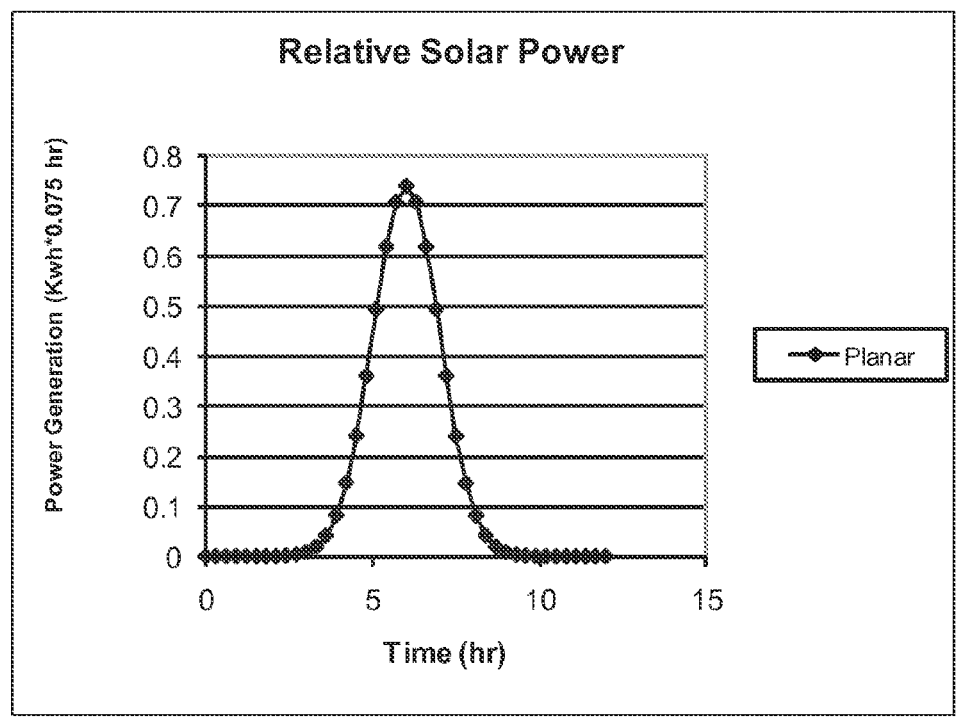
FIG. 15 is a graph showing a potential power generation for a planar solar cell.

Assuming an average of $\mu=6$ hours, a standard deviation of $\sigma=1$ hour, and integrated power of 6.18 kwh/m$^2$ for an average day gives a maximum energy. When $x=\mu$, the theoretical maximum power generated is about 4.933 kWhr/m$^2$. Based on EU studies of layering, the importance of having each solar event near the p-n junction, and reduced hot spots, the CdTe system may approach its theoretical efficiency limit. Efficiency could get as high as 30% with the single layer systems and potentially higher if we combined a high and low band gap system (discussed earlier). The distributions are shown in FIG. 15.

The power calculation works out as follows:

$P=6.18$ kWh/(m$^2$×d) from the mean values for a California city $P_{Brush}=P \times E \times O$ Thus, where E=29 (29% efficiency) for a CdTe/CdS PV cell and O=the orientation gain 1.8 (8% gain), $P_{Brush}=2.60$ kWhr/(m$^2$×d) (average day in the mean city in CA).

However, it should be noted that the brush can pick up about a 8.8% gain in efficiency by because it would require little if any sun orientation adjustments. The orientation of the solar brush 10 may have a large effect on performance. Planar PV modules lose up to 8% power from poor orientation and often need to be reoriented using a "solar compass". Due to its unique design, the solar brush 10 does not require reorientation.

If electrical current through the PV device is sufficiently high, a cooling systems that could either be used to generated thermoelectric power (i.e. steam turbine type of power generation) or water heating systems for home use could also be possible.

A majority of the light from the sun is scattered from the atmosphere. Collecting scattered light using the solar brush 10 should lead to even higher energy production. Further energy gains from multi junction solar cells may bump the efficiency to double what is believed to be currently possible.

The solar brush 10 will probably approach the theoretical maximum efficiency for a given material. Because the brush can be made nearly transparent, most of the light continues to travel through the cell. For practical purposes, the brush would appear to be of ∞ thickness. Because the bristles can be designed just thick enough for stable solar absorption, each absorptive event would happen near the p-n junction. The occurrence of the absorptive event near the p-n junction improves cell efficiency. Another key to improving cell efficiency is to reduce localized heating. Each time there is solar absorption, part of the energy ejects the electron and part of the energy heats the cell. The heating reduces the efficiency of the cell. When cells rely on back reflection, they are also doubling the heat load for a given areas. As the sun moves across the sky, the penetration angle is changing and the trajectory of the solar stream is changing so there is a greater quantity of "fresh" material for the photons to impact. With the solar brush 10, more of the absorption events can be made to occur near the p-n junction through control of the layer thicknesses, and the light stream will pass through greater amounts of PV material. Multiple junction material is believed to be the key to maximum efficiency in the future. Table 5 shows efficiency potential, band gap, and field efficiencies for several materials.

TABLE 5

Efficiencies of photovoltaic material

| Material | Theoretical Maximum Efficiency (%) | Laboratory Maximum Efficiency (%) | Field Efficiency (%) | Band Gap (eV) |
|---|---|---|---|---|
| Single Crystal SI | 27 | 23.5 | 14.0-17.0 | 1.1 |
| Si HIT single crystal | 27 | 21.0 | 15.5-16.5 | 1.1 |
| Si Poly Crystal | 27 | 20.0 | 11.5-14.2 | 1.1 |
| Si Ribbon | 27 | 17 | 11.0-13.0 | 1.1 |
| CIS | 24 | 18 | 9.0-11.5 | 0.9 |
| GaAs | 30 | | | 1.4 |
| CdTe | 29 | 17 | 8.0-10.0 | 1.5 |
| Amorphous Si | 25 | 13.0 | 5.0-9.5 | 1.7 |
| Indium Gallium Nitride | 31* | 17 | 8.5-11.05 | 0.8 |
| Graetzel | 20* | 10.9 | 45 | |
| Polymer | 9* | 4.9 | | 1.0-2.5 |

*indicates that the value is an estimate.

Efficiency compares favorably with current technologies to give the maximum power increases. Table 6 shows the potential energy efficiency and power generation capability in the state of California.

TABLE 6

Potential energy efficiency and power generation in California

| Material | Efficiency | kW * hr/Day/m$^2$ |
|---|---|---|
| PV Brush (CdTe) | ~29 | 2.60 |
| Single Crystal Si | 17 | 1.19 |
| Polymer | 2.0 | 0.11 |

Power generation and effective areas for the brush can be significantly boosted through the use of a solar concentrator. A solar concentrator could redirect large areas of light perpendicular to the surface, thereby utilizing the surface area at the depths of the brush. Only light angles close to 90° can penetrate a high area shell. The penetration depth in shown by FIG. 1 is the spacing distance between bristles times tan $\Theta$. As $\Theta$ approaches 90°, tan $\Theta$ approaches $\infty$ and the required penetration level is achieved. The effective area of the solar cell is calculated by dividing the penetration dept by the bristle height and multiplying it by the area. The power output of a high efficiency, high area solar cell in one embodiment is between 50 and 285 kW/day/m$^2$ with a solar concentrator. The output ranges compare favorably with the maximum output of 0.94 kW/day/m$^2$ based on the best known field results ever for single silicon PV arrays that are produced with a process which is probably much more costly than the methods and structures presented herein.

Konarka uses a technology where printed polymers generate energy from all visible spectra. As described in http://www.konarkatech.com/about/, PV polymers are printed on polymer sheets. Materials are produced by injecting a dye into titanium dioxide and printing the material on to polymers. The Konarka technology is expected to yield 10% efficiency and last about 8 years. In comparison, the materials disclosed herein that are used for the solar brush 10 have a lifespan in the 25 to 30 year time frame. Konarka's process may be 100 times less expensive than the solar brush 10 but produces PV cells of only around 2% efficiency. Furthermore, these PV cells would not have a form that is compatible with concentrators. Therefore, the maximum power Konarka's PV film would expect to generate on a given day would be about 0.11 kW/m$^2$, and the brush could generate between 450 and 2500 times the power that the Konarka system generates.

Table 7 illustrates the power generation for 8" disk PV cells. Reference is made to Table 3, above, for definitions of column headings.

TABLE 7

High efficiency solar cell power generation for 8" disk PV cells.

| Bristle Height (μm) | Bristle Diameter (nm) | Cable Density (#/m$^2$) | Area (m$^2$/m$^2$ planar) | Estimated High Efficiency Power Generation (kWhr/ m$^2$ * day) |
|---|---|---|---|---|
| 50 | 220 | 5 × 26$^2$ | 172.76 | 48.06 |
| 100 | 220 | 5 × 26$^2$ | 345.52 | 96.12 |
| 50 | 10 | 1 × 26$^2$ | 50.26 | 13.98 |
| 100 | 10 | 1 × 26$^2$ | 100.54 | 27.96 |

Solar brushes 10 may be made from disks of 11" diameter, or can be grown from any dimension films using oxide templates. They can use existing photolithography and sputtering machines. If an 8" diameter disk is used, it would generate the power equivalent of 0.97 to 5.58 m2 planar photovoltaic cells. If a perfect reflector were used in the solar collector, the minimum dish size would range from a diameter of 1.1 m to 14.8 m for full utilization of the PV cell area. Because perfect reflectors do not exist, some of the energy would be lost to absorption and misdirected reflections. A 2 to 25 m diameter may be used to generate the maximum energy. Smaller units can be produced if desired, the size being a function of the power requirements and the installation location. The 8" disk could generate 1.6 to 24.42 kW/day depending on the final area and thickness of material on a disk. The system is also preferably sized to allow proper current conduction without undue system heating of the substrate metal.

The small disk size will allow easy cleaning and reduce efficiency losses over time. Since the area of the central disk is so small, it may be designed to snap in and out to be cleaned in a way that is impractical for larger cells.

The wide range of methods to form nanocables on either flexible or rigid substrate that is shaped to a given specification then hardened impacts the efficiency of the film.

Hard coatings such as TiN, ZrN, or HfN that have melting points around 3,000° C. may be used for certain layers to minimize reflectance or as a reinforcement "jacket" to increase the hardness of the nanocables.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for creating a nanostructure, comprising:
    depositing material in a template to form an array of nanocables, wherein each nanocable in the array of nanocables comprises an upper portion and a lower portion;
    removing only a portion of the template to expose the upper portion of each nanocable in the array of nanocables, such that a remaining portion of the template forms an insulating layer between the lower portions of the nanocables in the array of nanocables; and
    forming at least one conformal layer on the upper portion of each nanocable in the array of nanocables,
    wherein, for each nanocable in the array, the at least one conformal layer on the upper portion of the nanocable comprises a photovoltaically active p-n junction.

2. The method of claim 1, wherein forming at least one conformal layer on the upper portion of each nanocable in the array of nanocables comprises electroplating.

3. The method of claim 1, wherein forming at least one conformal layer on the upper portion of each nanocable in the array of nanocables comprises chemical vapor deposition.

4. The method of claim 2, wherein forming at least conformal layer on the upper portion of each nanocable in the array of nanocables comprises sputtering a layer of CIS, CIGS, or CdTe/CdS.

5. The method of claim 1, wherein removing only a portion of the template comprises dissolving a portion of the template.

6. The method of claim 1, wherein the template comprises a polymeric material.

7. The method of claim 1, wherein, for each nanocable in the array of nanocables, the photovoltaically active p-n junction comprises a junction surface that is substantially conformal to the upper portion of the nanocable.

* * * * *